United States Patent
Mizutani

(10) Patent No.: US 6,525,346 B2
(45) Date of Patent: Feb. 25, 2003

(54) SEMICONDUCTOR DEVICE AND ITS MANUFACTURING METHOD CAPABLE OF REDUCING LOW FREQUENCY NOISE

(75) Inventor: Hiroshi Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/734,685

(22) Filed: Dec. 13, 2000

(65) Prior Publication Data

US 2001/0016377 A1 Aug. 23, 2001

(30) Foreign Application Priority Data

Dec. 14, 1999 (JP) .......................................... 11-355113

(51) Int. Cl.[7] .......................................... H01L 31/0328
(52) U.S. Cl. ...................... 257/183; 257/199; 257/142
(58) Field of Search .......................... 438/46, 47, 237, 438/235, 167, 170, 171, 172, 312, 314, 319; 257/183, 199, 656, 195, 481, 482, 603, 604, 472

(56) References Cited

U.S. PATENT DOCUMENTS 5,422,501 A * 6/1995 Bayraktaroglu ............. 257/195
5,837,589 A * 11/1998 McNamara et al. ......... 257/197
5,930,636 A * 7/1999 Oki et al. .................... 257/197

FOREIGN PATENT DOCUMENTS

| JP | 64-90581 | 4/1989 |
| JP | 1-220860 | 9/1989 |
| JP | 4-211172 | 8/1992 |
| JP | 7-263643 | 10/1995 |
| JP | 10-51012 | 2/1998 |
| JP | 2793983 | 6/1998 |

* cited by examiner

Primary Examiner—Tuan H. Nguyen
(74) Attorney, Agent, or Firm—Sughrue Mion, PLLC

(57) ABSTRACT

In a semiconductor device, a first semiconductor layer is formed on a semiconductor substrate. A second semiconductor layer is formed on a part of the first semiconductor layer, and a third semiconductor layer is formed on a part of the second semiconductor layer. A first electrode is formed on the third semiconductor layer, and a second electrode is formed on the first semiconductor layer in contact with the second semiconductor layer and apart from the semiconductor layer, thus forming a diode.

23 Claims, 30 Drawing Sheets

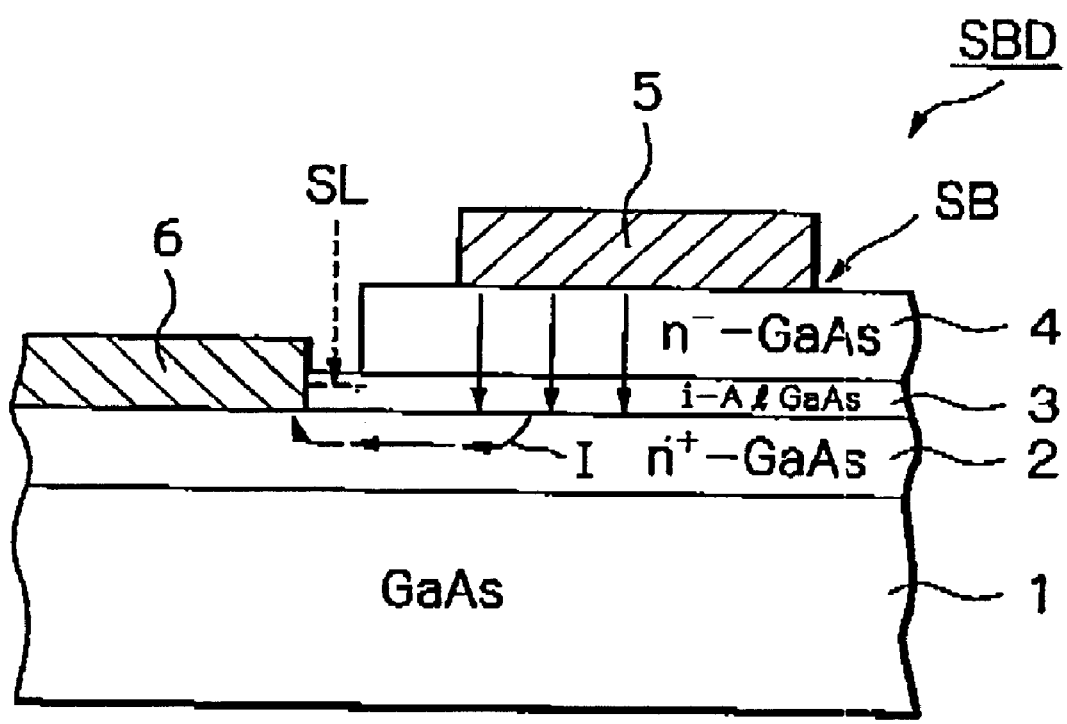

SEMICONDUCTOR DEVICE AND ITS MANUFACTURING METHOD CAPABLE OF REDUCING LOW FREQUENCY NOISE

BACKGROUND OF THE INVENTION

1. Field of the Invention

The present invention relates to a semiconductor device and its manufacturing method, and more particularly, to a diode such as a Schottky barrier diode (SBD), a tunnel diode and a PIN diode and its manufacturing method.

2. Description of the Related Art

A first prior art Schottky barrier diode is of a lateral type which is constructed by a semi-insulating GaAs substrate, an $n^-$-type GaAs contact layer formed on the GaAs substrate, an $n^+$-type GaAs layer formed on the $n^-$-type GaAs contact layer, an anode electrode (Schottky electrode) formed on the $n^-$-type GaAs contact layer, and a cathode electrode (ohmic electrode) formed on the $n^+$-type GaAs layer. This will be explained later in detail.

In the above-described first prior art Schottky barrier diode, however, since the path of the current adjacent to the surface of the $n^-$-type GaAs contact layer is relatively long and, is also very close thereto, the current is affected strongly by a surface level of the $n^-$-type GaAs contact layer. As a result, the low frequency noise characteristics such as 1/f noise of the Schottky barrier diode remarkably deteriorates.

A second prior art Schottky barrier diode is of a vertical type which is constructed by a semi-insulating GaAs substrate, an $n^+$-type GaAs contact layer formed on the GaAs substrate, an $n^-$-type GaAs layer formed on the $n^+$-type GaAs layer, an anode electrode (Schottky electrode) formed on the $n^-$-type GaAs layer 203, and a cathode electrode (ohmic electrode) formed on the $n^+$-type GaAs contact layer (see JP-A-8-255838). This also will be explained later in detail.

Thus, in the above-described second prior art Schottky barrier diode, the path of the current adjacent to the surface of the $n^+$-type GaAs contact layer is shortened, which would improve the low frequency characteristics.

In the second prior art Schottky barrier diode, however, since the path of the current adjacent to the surface of the $n^-$-type GaAs contact layer is still close thereto, the current is still affected strongly by the surface level of the $n^+$-type GaAs contact layer. As a result, the low frequency noise characteristics of the Schottky barrier diode still deteriorates.

SUMMARY OF THE INVENTION

It is an object of the present invention to provide a semiconductor device such as a diode and its manufacturing method capable of reducing the low frequency noise.

Another object is to provide such a semiconductor device incorporating a heterojunction field effect transistor and a heterojunction bipolar transistor and its manufacturing method.

According to the present invention, in a semiconductor device, a first semiconductor layer is formed on a semiconductor substrate. A second semiconductor layer is formed on a part of the first semiconductor layer, and a third semiconductor layer is formed on a part of the second semiconductor layer. A first electrode is formed on the third semiconductor layer, and a second electrode is formed on the first semiconductor layer in contact with the second semiconductor layer and apart from said the semiconductor layer, thus forming a diode.

Thus, the current path is distant from the surface level of the second semiconductor layer, to improve the low frequency noise characteristics.

Also, the cathode electrode is buried in the first semiconductor layer so that the current path is further distant from the surface level of the second semiconductor layer, to further improve the low frequency noise characteristics.

BRIEF DESCRIPTION OF THE DRAWINGS

The present invention will be more clearly understood front the description set forth below, as compared with the prior art, with reference to the accompanying drawings, wherein:

FIG. 4 is a cross-sectional view illustrating a first embodiment of the diode according to the present invention;

DESCRIPTION OF THE PREFERRED EMBODIMENTS

Before the description of the preferred embodiments, prior art diodes will be explained with reference to FIGS. 1, 2 and 3.

Figure 1:
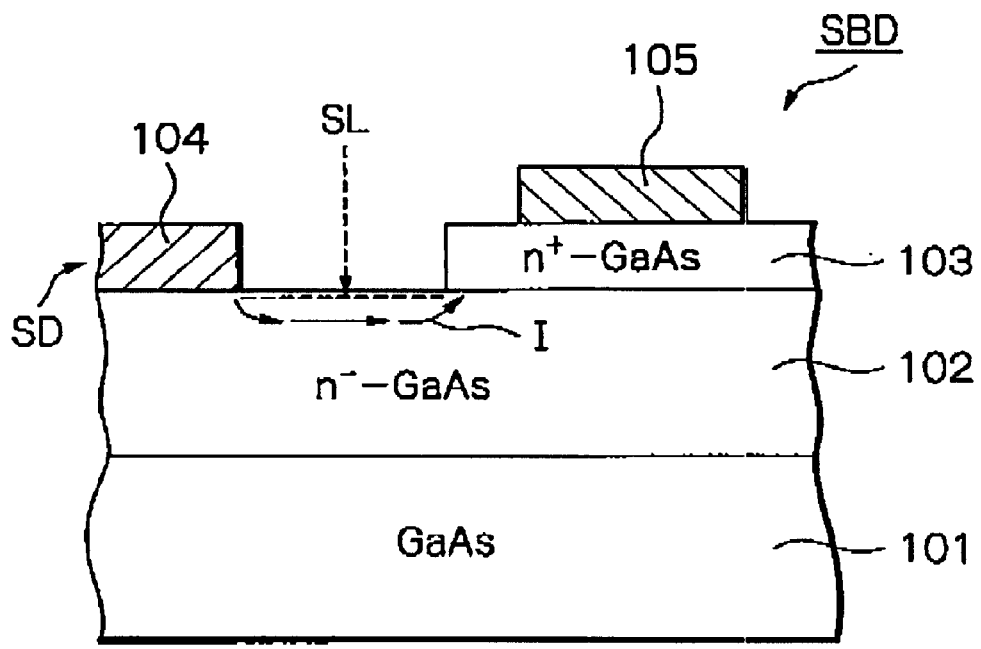
FIG. 1 is a cross-sectional view illustrating a first prior art diode.

In FIG. 1, which illustrates a first prior art diode that is, in this case, a Schottky barrier diode SBD, the Schottky barrier diode SBD is of a lateral type which is constructed by a semi-insulating GaAs substrate 101, an n⁻-type GaAs contact layer 102 formed on the GaAs substrate 101, an n⁺-type GaAs layer 103 formed on the n⁻-type GaAs contact layer 102, an anode electrode 104 formed on the n⁻-type GaAs contact layer 102, and a cathode electrode 105 formed on the n⁺-type GaAs layer 103. Note that a Schottky barrier SB is generated of at an interface between the anode electrode 104 and the n⁻-type GaAs contact layer 102.

In the Schottky barrier diode SBD of FIG. 1, when a forward bias voltage is applied to the anode electrode 104 and the cathode electrode 105, a current as indicated by an arrow I flows from the anode electrode 104 to the n⁺-type GaAs layer 103 in parallel with the surface of the n⁻-type GaAs contact layer 102, and then, the current I flows from the n⁺-type GaAs layer 103 to the cathode electrode 105.

In the Schottky barrier diode SBD of FIG. 1, however, since the path of the current I adjacent to the surface of the n⁻-type GaAs contact layer 102 is relatively long, and, is also very close thereto, the current I is affected strongly by a surface level SL of the n⁻-type GaAs contact layer 102. As a result, the low frequency noise characteristics of the Schottky barrier diode SBD of FIG. 1 remarkably deteriorate.

Figure 2:
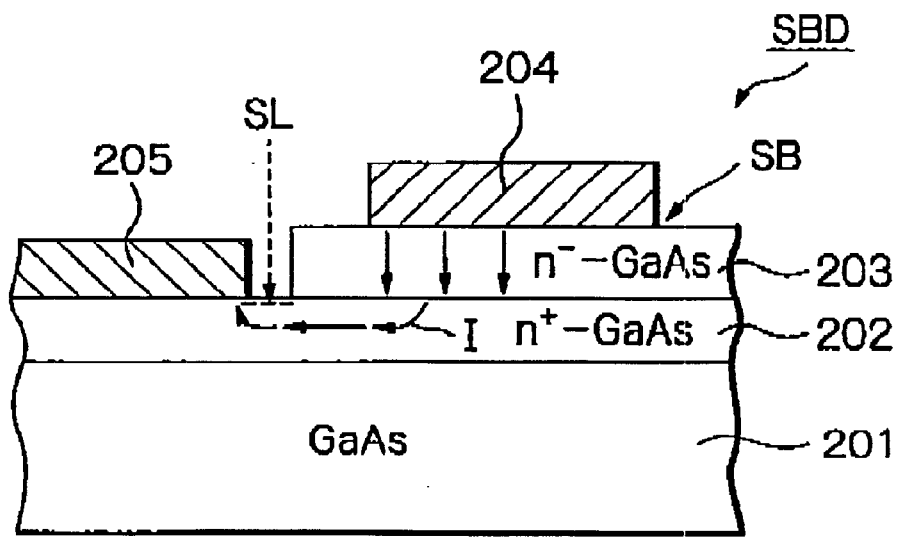
FIG. 2 is a cross-sectional view illustrating a second prior art diode.

In FIG. 2, which illustrates a second prior art diode that is, in this case, a Schottky barrier diode SBD (see JP-A-8-255838), the Shottky barrie diode SBD is of a vertical type which is constructed by a semi-insulating GaAs substrate 201, an n⁺-type GaAs contact layer 202 formed on the GaAs substrate 201, an n-type GaAs layer 203 formed on the n⁺-type GaAs layer 202, an anode electrode 204 formed on the n⁻-type GaAs layer 203, and a cathode electrode 205 formed on the n⁺-type GaAs contact layer 203. Note that a Schottky barrier SB is generated at an interface between the anode electrode 204 and the n⁻-type GaAs layer 203.

In the Schottky barrier diode SBD of FIG. 2, when a forward bias voltage is applied to the anode electrode 204 and the cathode electrode 205, a current as indicated by an arrow I flows from the anode electrode 204 to the n⁻-type GaAs layer 203 perpendicular to the surface of the n⁻-type GaAs layer 203, and then, the current I flows from the n⁻-type GaAs layer 203 via the n⁺-type GaAs contact layer 21)2 to the cathode electrode 205 in parallel with the surface of the n⁺-type GaAs contact layer 202.

Thus, the path of the current I adjacent to the surface of the n⁺-type GaAs contact layer 202 is shortened, which would improve the low frequency characteristics.

In the Schottky barrier diode SBD of FIG. 2, however, since the path of the current I adjacent to the surface of the n⁻-type GaAs contact layer 202 is still close thereto, the current I is still affected strongly by a surface level SL of the n⁺-type GaAs contact layer 202. As a result, the low frequency noise characteristics of the Schottky barrier diode SBD of FIG. 2 still deteriorate.

Figure 3:
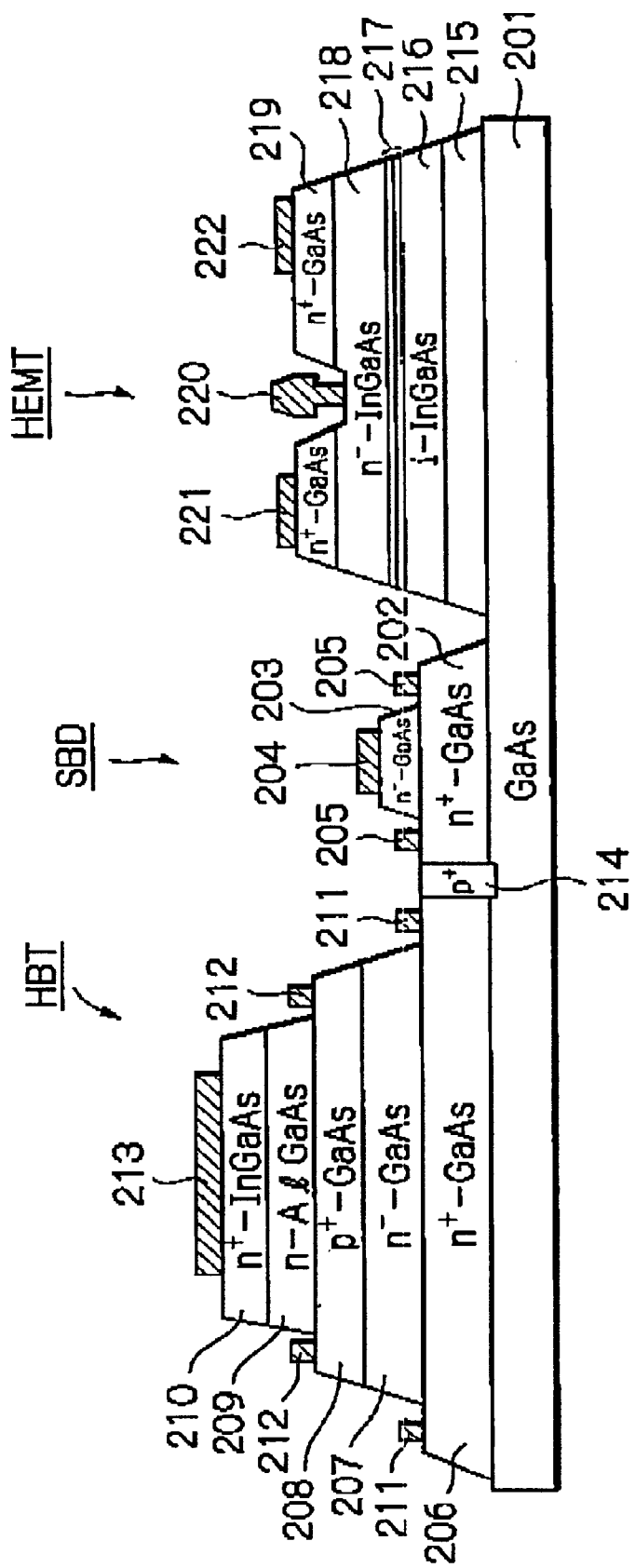
FIG. 3 is a cross-sectional view illustrating a semiconductor device to which the diode of FIG. 2 is applied.

In FIG. 3, which illustrates a semiconductor device to which the Schottky barrier diode SBD of FIG. 2 is applied, a heterojunction bipolar transistor HBT and a high electron mobility transistor HEMT as well as the Schottky barrier diode SBD of FIG. 2 are formed in one chip.

The heterojunction bipolar transistor HBT is constructed by an n⁺-type GaAs sub collector layer 206, an n⁻-type GaAs collector layer 207, a p+-type GaAs base layer 208 an n-type AlGaAs emitter layer 209, an n⁺-type GaAs emitter cap layer 210, collector electrodes 211, base electrodes 212 and a collector electrode 213.

The Schottky barrier diode SBD and the heterojunction bipolar HBT are isolated by a p-type element isolation region 214 formed within the n⁺-type GaAs layer 202 and the n⁺-type GaAs layer 206 which are actually the same.

On the other hand, the high electron mobility transistor HEMT is constructed by a super lattice buffer layer 215, an i-type InGaAs channel layer 216, an n-type silicon planar doped layer 217, an n-type AlGaAs layer donor layer 218, n⁺-type GaAs source/drain layers 219, a T-shaped gate electrode 220, a source electrode 221, and a drain electrode 222.

When forming the semiconductor device of FIG. 3, an epitaxial layer for the layers 202, 203, 206, 207, 208, 209 and 210 is grown on the GaAs substrate 201 by a molecular beam epitaxy (MBE) process. Then, an area of the epitaxial layer for the high electron mobility transistor HEMT is etched by using a mask which covers an area of the epitaxial layer for the heterojunction bipolar transistor HBT and the Schottky barrier diode SBD. Then, another epitaxial layer for the layers 215, 216, 217, 218 and 219 is regrown on the GaAs substrate 201. Finally, each layer of the epitaxial layers is patterned, and then, each electrode is formed to complete the semiconductor device of FIG. 3.

In the semiconductor device of FIG. 3, however, since an epitaxial layer regrowing process is required, a deep trap level is generated at an interface between the n⁺-type GaAs contact layer 202 and the GaAs substrate 201, which also deteriorates the low frequency noise characteristics. Also, the epitaxial layer regrowing process increases the manufacturing cost. Further, the characteristics among wafers and among lots fluctuate, which would decrease the manufacturing yield.

In FIG. 4, which illustrates a first embodiment of the diode according to the present invention that is, in this case, a Schottky barrier diode SBD, the Shottky barrie diode SBD is of a vertical type which is constructed by a semi-insulating GaAs substrate 1, an n⁺-type GaAs contact layer 2 formed on the GaAs substrate 1, an undoped AlGaAs etching stopper layer 3 formed on the n⁺-type GaAs contact layer 2, an n⁻-type GaAs layer 4 formed on the i-type AlGaAs etching stopper layer 3, an anode electrode 5 formed on the n⁻-type GaAs layer 4, and a cathode electrode 6 formed on the n⁺-type GaAs contact layer 2. Note that a Schottky barrier SB is generated at an interface between the anode electrode 5 and the n⁻-type GaAs layer 4.

In the Schottky barrier diode SBD of FIG. 4, when a forward bias voltage is applied to the anode electrode 5 and the cathode electrode 6, a current as indicated by an arrow I flows from the anode electrode 5 to the n⁻-type GaAs layer 4 perpendicular to the surface of the n⁻-type GaAs layer 4, and then, the current I flows from the n⁻-type GaAs layer 4 via the i-type AlGaAs etching stopper layer 3 and the n⁺-type GaAs contact layer 2 to the cathode electrode 6 in parallel with the surface of the n⁺-type GaAs contact layer 2.

In the Schottky barrier diode SBD of FIG. 4, although the path of the current I adjacent to the surface of the n⁺-type GaAs contact layer 2 is still close thereto, there is no surface level within the n⁺-type GaAs contact layer 2 due to the presence of the i-type AlGaAs etching stopper layer 3. In this case, a surface level SL may be generated in the i-type AlGaAs etching stopper layer 3; however, the path of the current I is distant from this surface level SL. Therefore, the current I is hardly affected by the surface level SL of the i-type AlGaAs etching stopper layer 3. As a result, the low frequency noise characteristics of the Schottky barrier diode SBD of FIG. 4 can be improved.

The method for manufacturing the Schottky barrier diode SBD of FIG. 4 will be explained next with reference to FIGS. 6A through 5E.

Figure 5A:
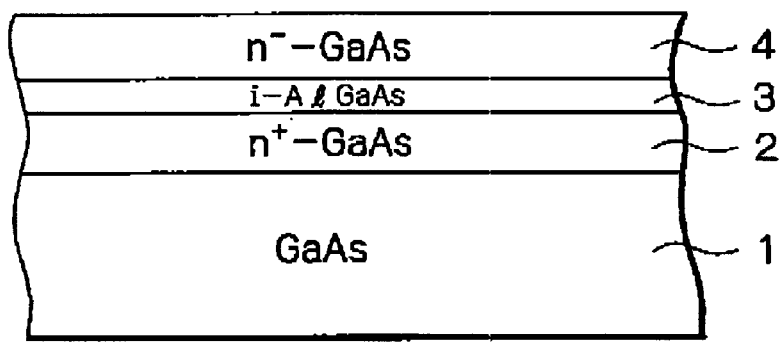
FIGS. 5A through 5E are cross-sectional views for explaining a method for manufacturing the diode of FIG. 4.

First, referring to FIG. 5A, an $n^+$-type GaAs contact layer 2, an i-type AlGaAs etching stopper layer 3 and an $n^-$-type GaAs layer 4 are grown on a semi-insulating GaAs substrate 1 by an MBE process, a metal-organic chemical vapor deposition (MOCVD) process or a vapor-phase epitaxy (VPE) process. In this case, the i-type AlGaAs etching stopper layer 3 is about 50 Å thick.

Figure 5B:
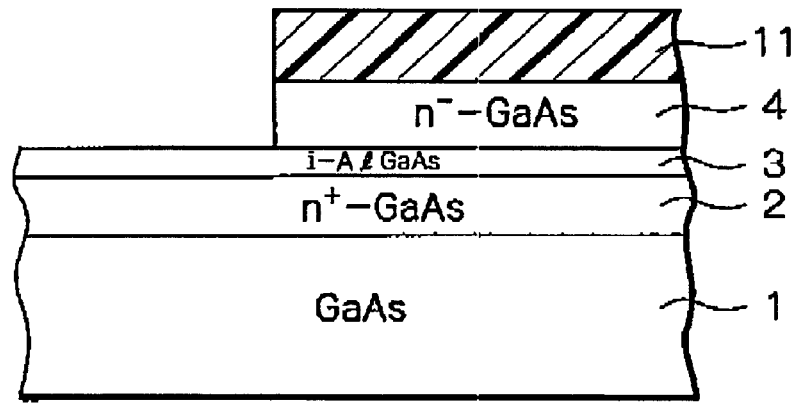

Next, referring to FIG. 5B, a photoresist pattern layer 11 is formed by a photolithography process. Then, the $n^-$-type GaAs layer 4 is etched by a selective dry etching process using $BCl_3$ gas and the i-type AlGaAs etching stopper layer 3 as an etching stopper. Then, the photoresist pattern layer 11 is removed.

Figure 5C:
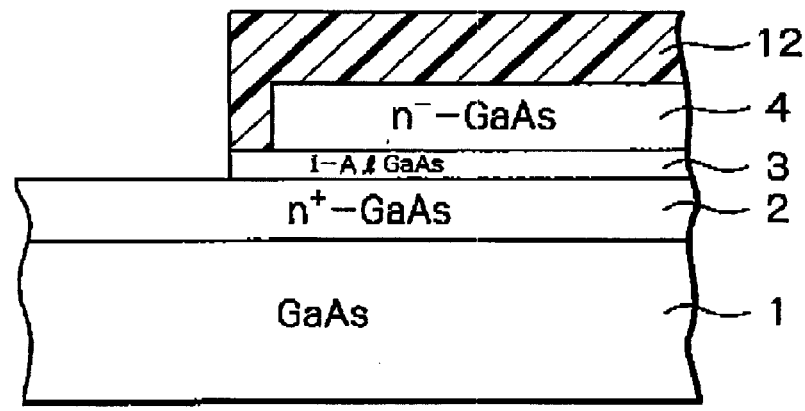

Next, referring to FIG. 5C, a photoresist pattern layer 12 is formed by a photolithography process. Then, the i-type AlGaAs etching stopper layer 3 is etched by a wet etching process using hydrogen peroxide water and the $n^+$-type GaAs layer 2 as an etching stopper. Then, the photoresist pattern layer 12 is removed.

Figure 5D:
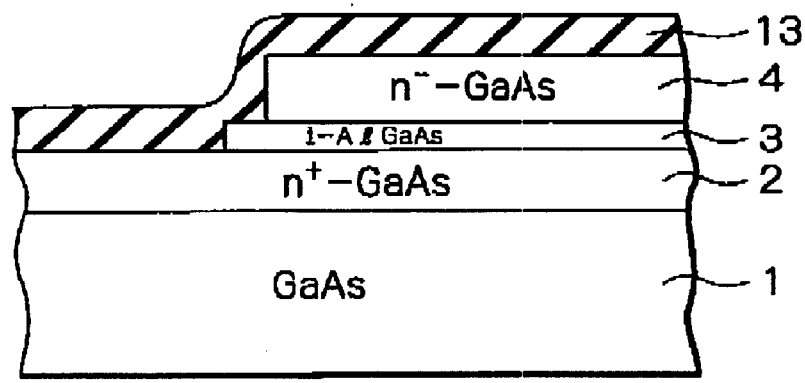

Next, referring to FIG. 5D, a silicon oxide layer 13 is deposited by a CVD process.

Figure 5E:
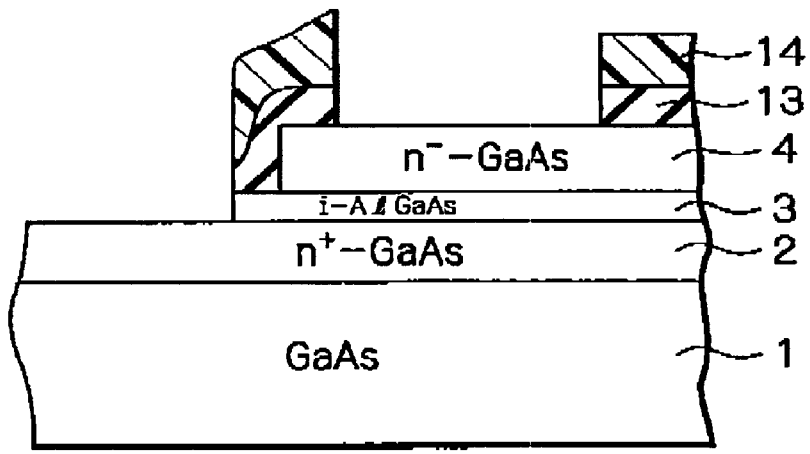

Next, referring to FIG. 5E, a photoresist pattern layer 14 is formed by a photolithography process. Then, the silicon oxide layer 13 is etched by a dry etching process using $SF_6$ gas.

Finally, an anode electrode 5 and a cathode electrode 6 are formed by a sputtering process and a lift-off process. Then, the photoresist pattern layer 14 is removed, to obtain the Schottky barrier diode SBD of FIG. 4. Note that the silicon oxide layer 13 is not shown in FIG. 4.

In the first embodiment, although the AlGaAs etching stopper layer 3 is undoped, the AlGaAs etching stopper layer 3 can be doped, i.e., of an n-type.

Figure 6:
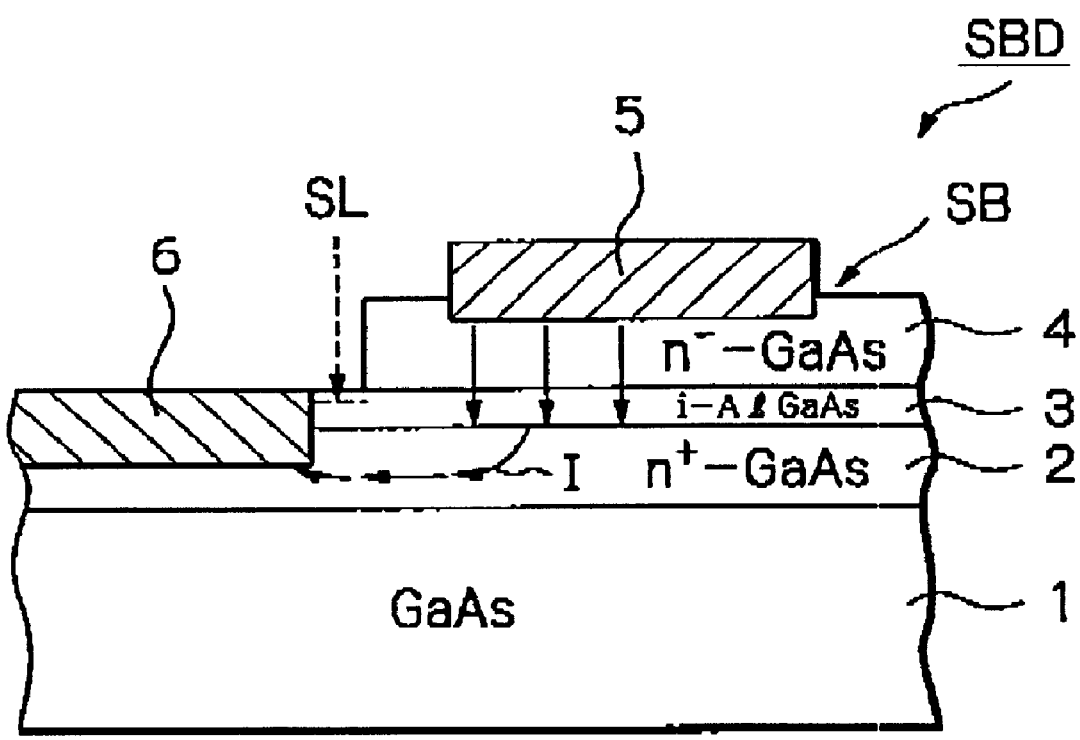
FIG. 6 is a cross-sectional view illustrating a second embodiment of the diode according to the present invention.

In FIG. 6, which illustrates a second embodiment of the diode according to the present invention, the anode electrode 5 and the cathode electrode 6 of FIG. 4 are buried in the $n^-$-type GaAs layer 4 and the $n^+$-type GaAs contact layer 2, respectively, of FIG. 4.

In the Schottky barrier diode SBD of FIG. 6, the path of the current I adjacent to the surface of the $n^+$-type GaAs contact layer 2 is distant therefrom, the path of the current I is further distant from the surface level SL. Therefore, the current I is hardly affected by the surface level SL of the i-type AlGaAs etching stopper layer 3. As a result, the low frequency noise characteristics of the Schottky barrier diode SBD of FIG. 6 can be further improved.

The method for manufacturing the Schottky barrier diode SBD of FIG. 6 will be explained next with reference to FIGS. 7A through 7F.

The manufacturing steps as illustrated in FIGS. 7A through 7E are the same as those as illustrated in FIGS. 5A through 5E, respectively.

Figure 7A:
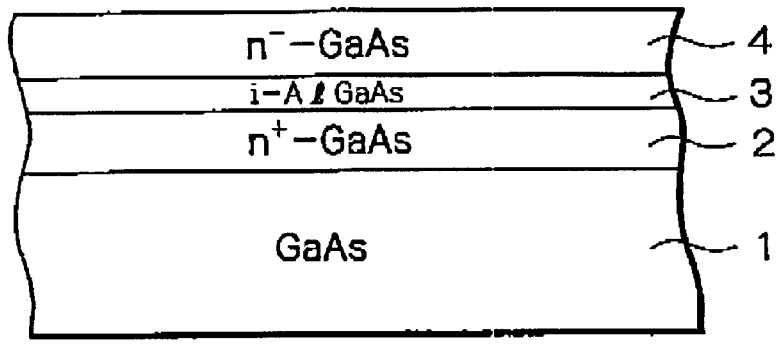
FIGS. 7A through 7F are cross-sectional views for explaining a method for manufacturing the diode of FIG. 6.
Figure 7B:
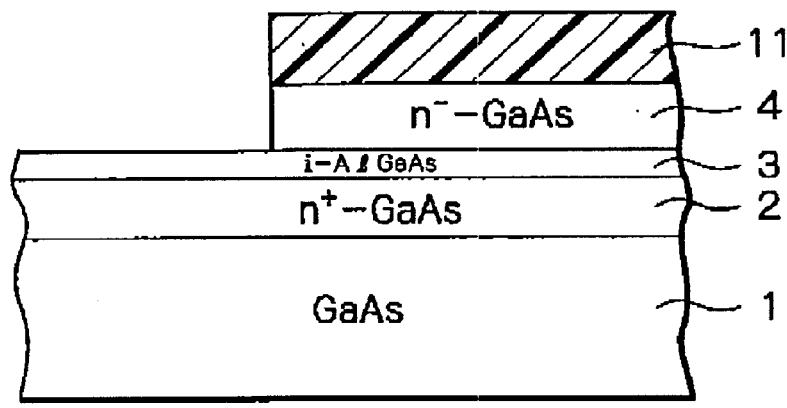
Figure 7C:
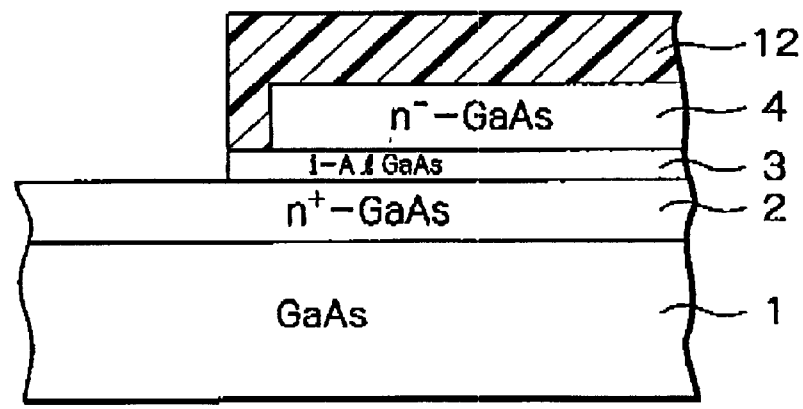
Figure 7D:
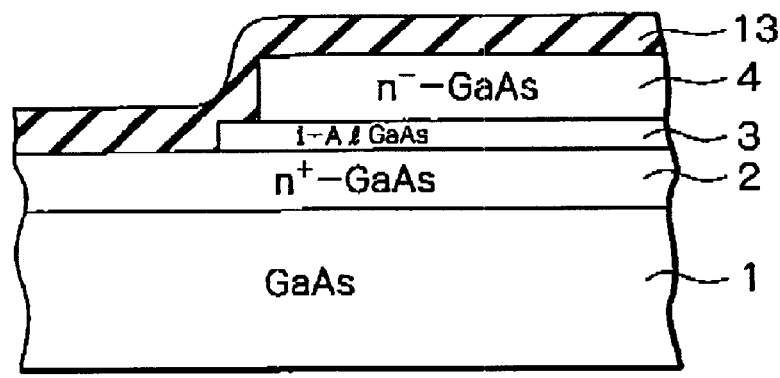
Figure 7E:
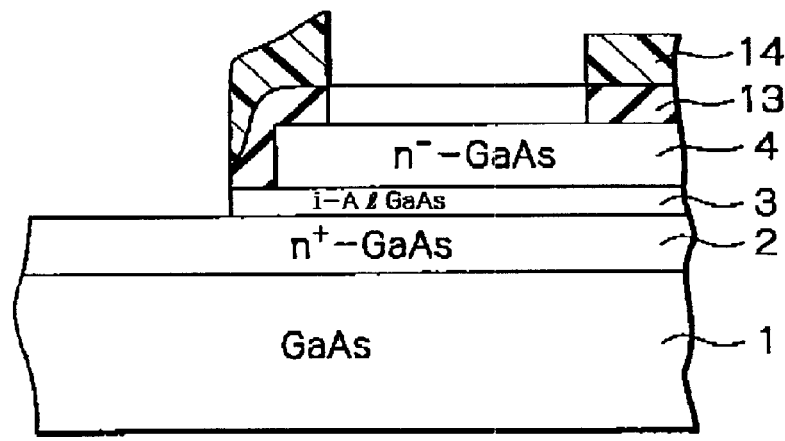
Figure 7F:
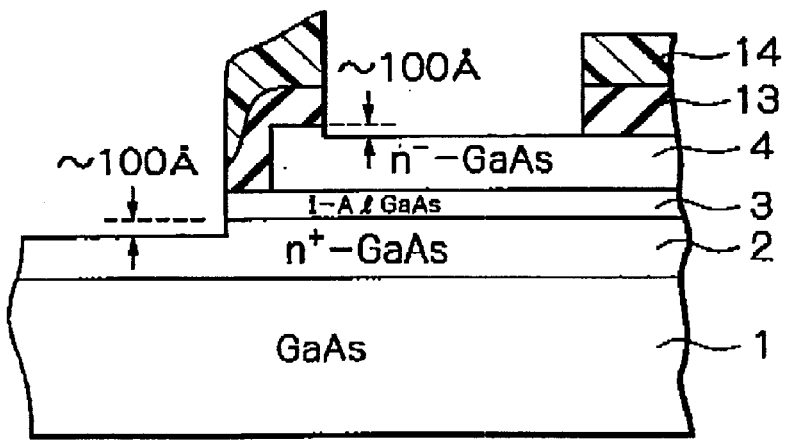

After the manufacturing step as illustrated in FIG. 7E, is carried out, referring to FIG. 7F, the $n^+$-type GaAs contact layer 2 and the $n^-$-type GaAs layer 4 are etched by a wet etching process using phosphoric acid. In this case, the etching depth of the $n^+$-type GaAs contact layer 2 and the $n^-$-type GaAs layer 4 is about 100 Å. Then, an anode electrode 5 and a cathode electrode 6 are formed by a sputtering process and a lift-off process. Then, the photoresist pattern layer 14 is removed, to obtain the Schottky barrier diode SBD of FIG. 6. Note that the silicon oxide layer 13 is not shown in FIG. 6.

Even in the second embodiment, although the AlGaAs etching stopper layer 3 is undoped, the AlGaAs etching stopper layer 3 can be doped, i.e., of an n-type.

Figure 8:
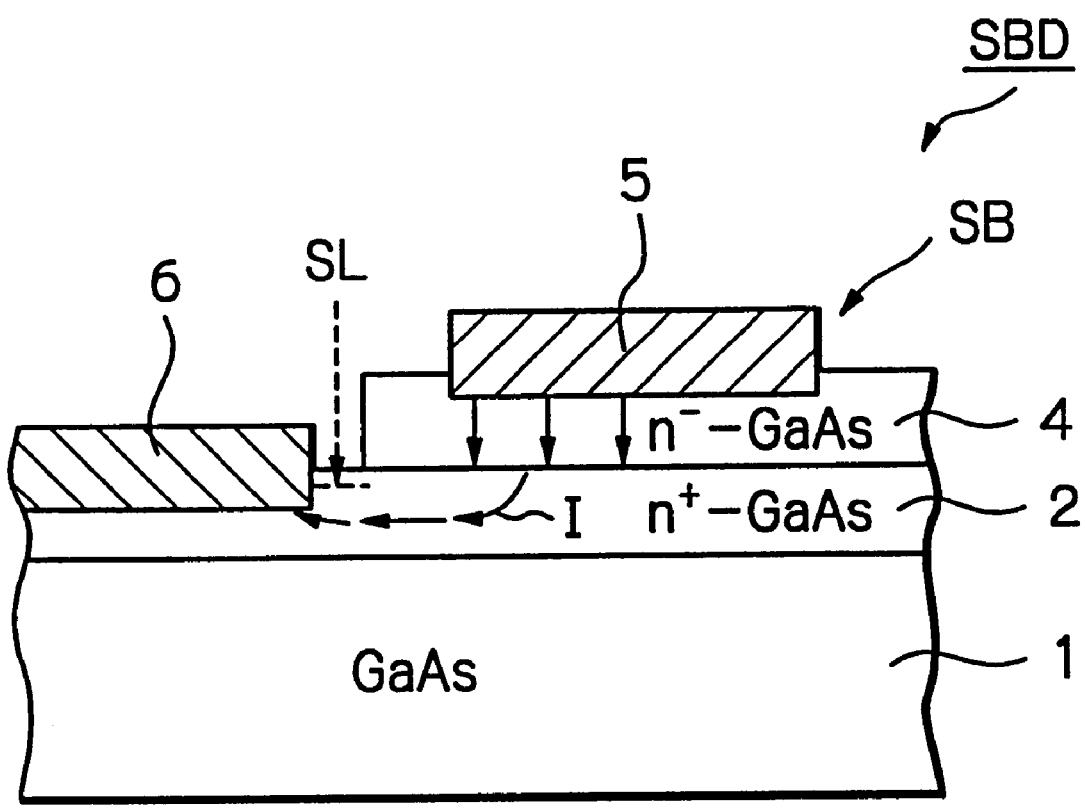
FIG. 8 is a cross-sectional view illustrating a third embodiment of the diode according to the present invention.

In FIG. 8, which illustrates a third embodiment of the diode according to the present invention, the i-type GaAs etching stopper layer 3 of FIG. B is omitted.

In the Schottky barrier diode SBD of FIG. 8, the path of the current I adjacent to the surface of the $n^+$-type GaAs contact layer 2 is distant therefrom, the path of the current I is distant from the surface level SL within the $n^+$-type GaAs contact layer 2. Therefore, the current I is hardly affected by the surface level SL of the $n^+$-type GaAs layer 2. As a result, the low frequency noise characteristics of the Schottky barrier diode SBD of FIG. 8 can be improved.

The method for Manufacturing the Schottky barrier diode SBD of FIG. 8 will be explained next with reference to FIGS. 9A through 9E.

Figure 9A:
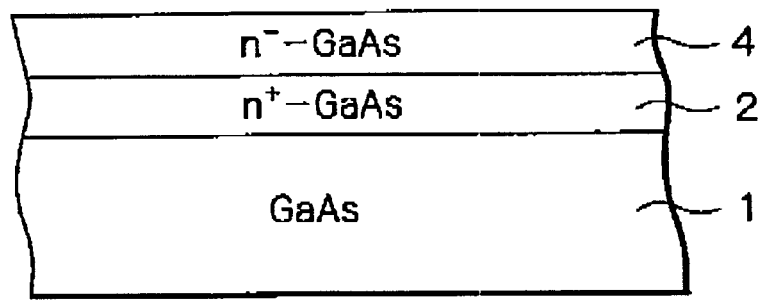
FIGS. 9A through 9E are cross-sectional views for explaining a method for manufacturing the diode of FIG. 8.

First, referring to FIG. 9A, an $n^+$-type GaAs contact layer 2 and an $n^-$-type GaAs layer 4 are grown on a semi-insulating GaAs substrate 1 by an MBE process, an MOCVD process or a VPE process.

Figure 9B:
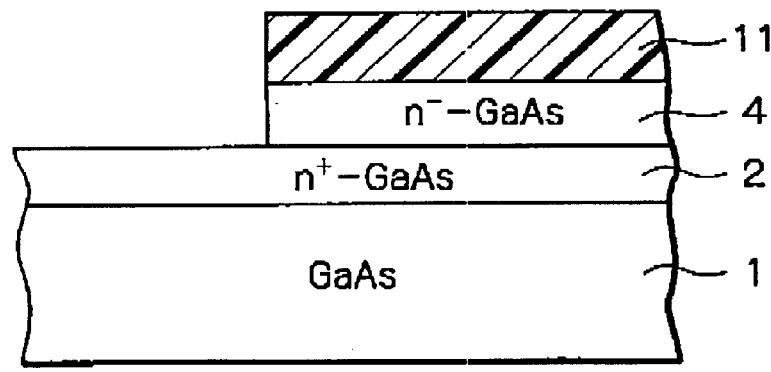

Next, referring to FIG. 9B, a photoresist pattern layer 11 is formed by a photolithography process. Then, the $n^-$-type GaAs layer 4 is etched by a selective dry etching process using $BCl_3$ gas. Then, the photoresist pattern layer 11 is removed.

Figure 9C:
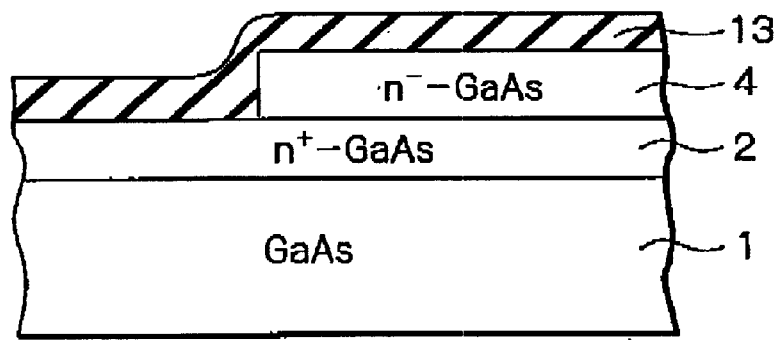

Next, referring to FIG. 9C, a silicon oxide layer 13 is deposited by a CVD process.

Figure 9D:
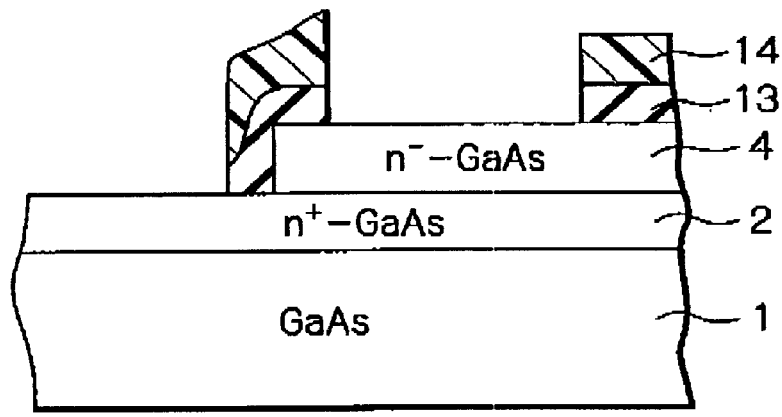

Next, referring to FIG. 9D, a photoresist pattern layer 14 is formed by a photolithography process. Then, the silicon oxide layer 13 is etched by a dry etching process using $SF_6$ gas.

Figure 9E:
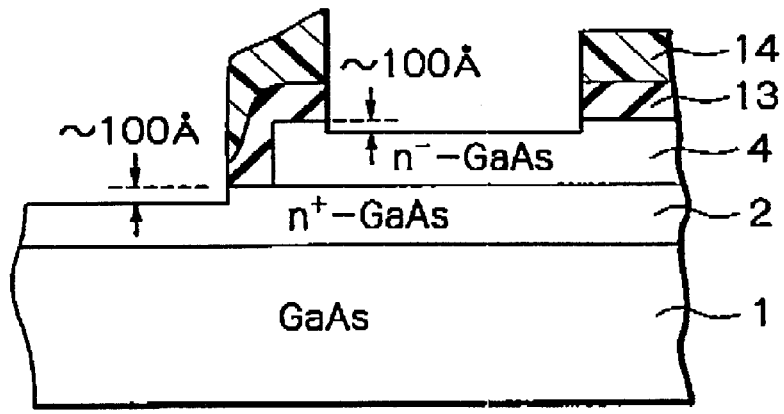

Next, referring to FIG. 9E, the $n^+$-type GaAs contact layer 2 and the $n^-$-type GaAs layer 4 are etched by a wet etching process using phosphoric acid. In this case, the etching depth of the $n^+$-type GaAs contact layer 2 and the $n^-$-type GaAs layer 4 is about 100 Å. Then, an anode electrode 5 and a cathode electrode 6 are formed by a sputtering process and a lift-off process. Then, the photoresist pattern layer 14 is removed, to obtain the Schottky barrier diode SBD of FIG. 8. Note that the silicon oxide layer 13 is not shown in FIG. 8.

Figure 10:
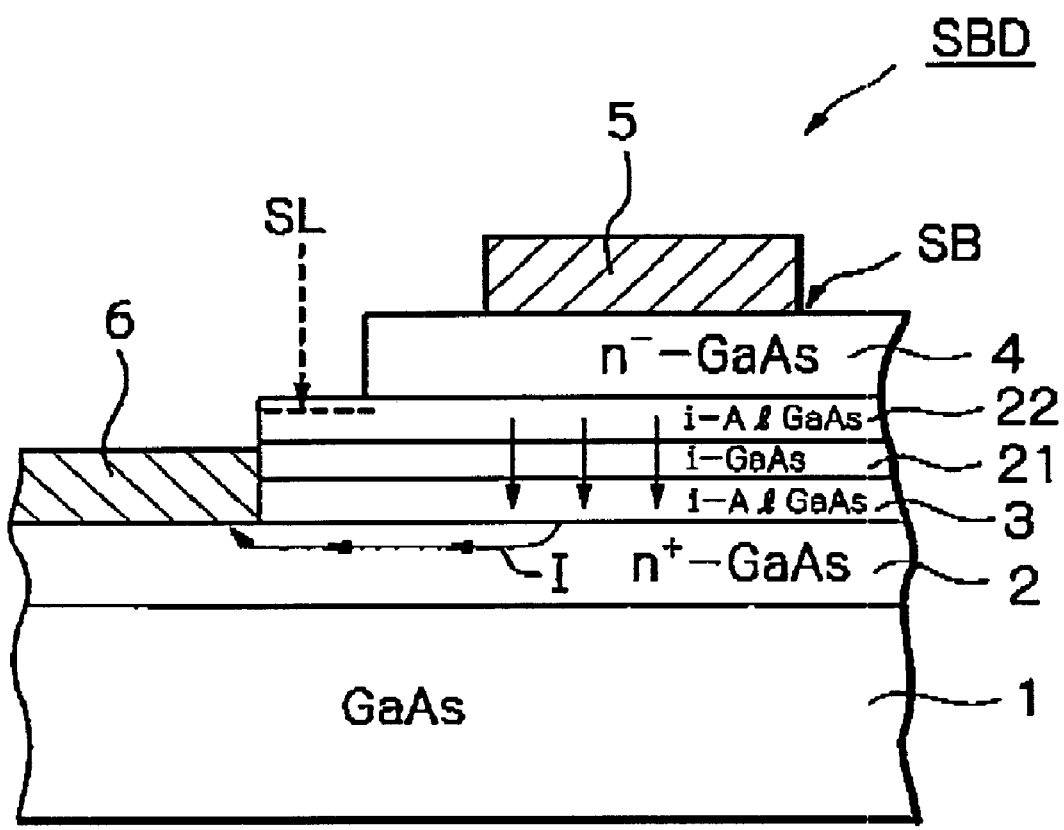
FIG. 10 is a cross-sectional view illustrating a fourth embodiment of the diode according to the present invention.

In FIG. 10, which illustrates a fourth embodiment of the diode according to the present invention that is, in this case, a Schottky barrier diode SBD, an i-type GaAs layer 21 and an i-type AlGaAs etching stopper layer 22 are added to the Schottky barrier diode SBD of FIG. 4.

In the Schottky barrier diode SBD of FIG. 10, a surface level SL may be generated in the i-type AlGaAs etching stopper layer 22; however, the path of the current I is far away from this surface level SL. Therefore, the current I is hardly affected by the surface level SL of the i-type AlGaAs etching stopper layer 22. As a result, the low frequency noise characteristics of the Schottky barrier diode SBD of FIG. 10 can be further improved.

The method for manufacturing the Schottky barrier diode SBD of FIG. 10 will be explained next with reference to FIGS. 11A through 11E.

Figure 11A:
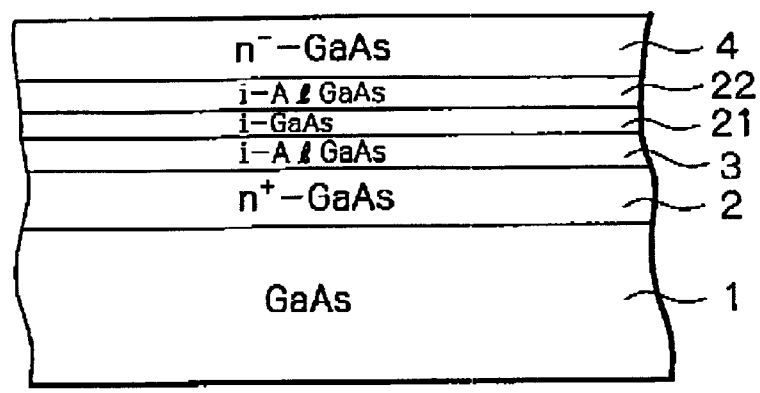
FIGS. 11A through 11E are cross-sectional views for explaining a method for manufacturing the diode of FIG. 10.
Figure 11B:
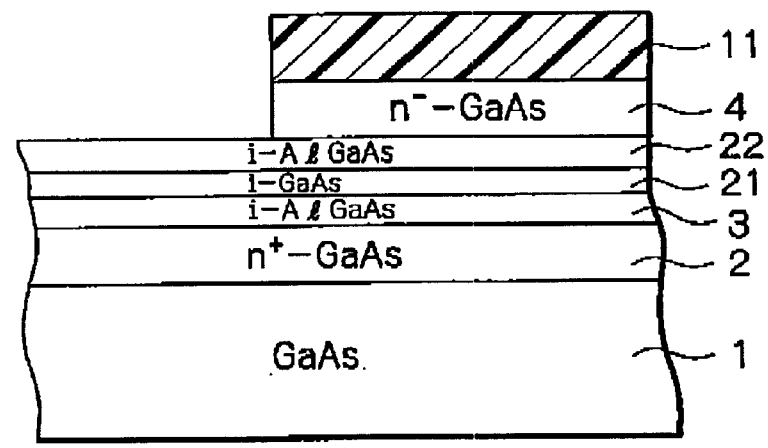

First, referring to FIG. 11A, an $n^+$-type GaAs contact layer 2, an i-type AlGaAs etching stopper layer 3, an i-type GaAs layer 21, an i-type AlGaAs etching stopper layer 22 and an $n^-$-type GaAs layer 4 are grown on a semi-insulating substrate 1 by an MBE process, an MOCVD process or a VPE process. In this case, the i-type AlGaAs etching stopper layers 3 and 22 are about 50 Å thick.

Next, referring to FIG. 11A, in the same way as in FIG. 5B, a photoresist pattern layer 11 is formed by a photolithography process. Then, the n⁻-type GaAs layer 4 is etched by a 1 selective dry etching process using BCl₃ gas and the i-type AlGaAs etching stopper layer 22 as an etching stopper. Then, the photoresist pattern layer 11 is removed.

Figure 11C:
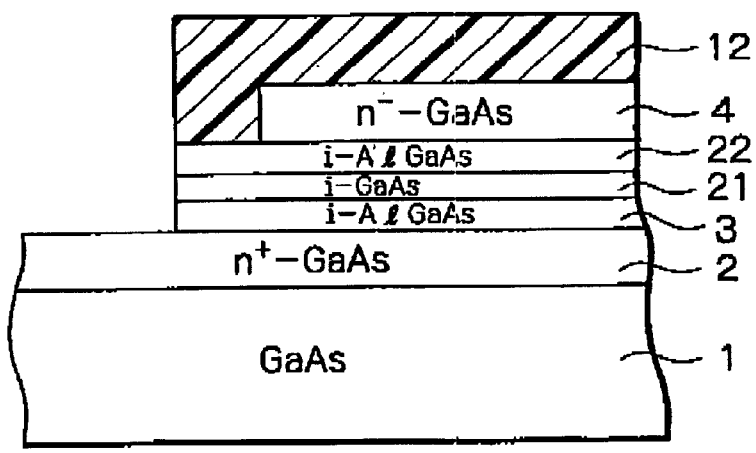

Next, referring to FIG. 11C, a photoresist pattern layer 12 is formed by a photolithography process. Then, the i-type AlGaAs etching stopper layer 22 is etched by a wet etching process using hydrogen peroxide water and the i-type GaAs layer 21 as an etching stopper. Then, the i-type GaAs layer 21 is etched by a I selective dry etching process using BCl₃ gas and the i-type AlGaAs etching stopper layer 3 as an etching stopper. Then, the i-type AlGaAs etching stopper layer 3 is etched by a wet etching process using hydrogen peroxide water and the n⁺-type GaAs layer 3 as an etching stopper. Then, the photoresist pattern layer 12 is removed.

Figure 11D:
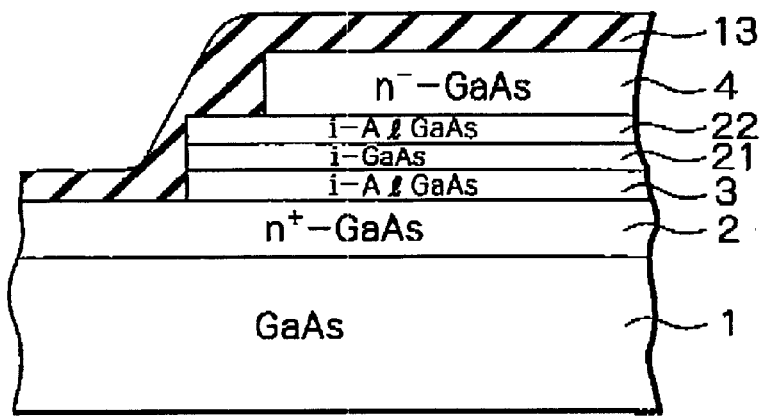

Next, referring to FIG. 11D, in the same way as in FIG. 5D, a silicon oxide layer 13 is deposited by a CVD process.

Figure 11E:
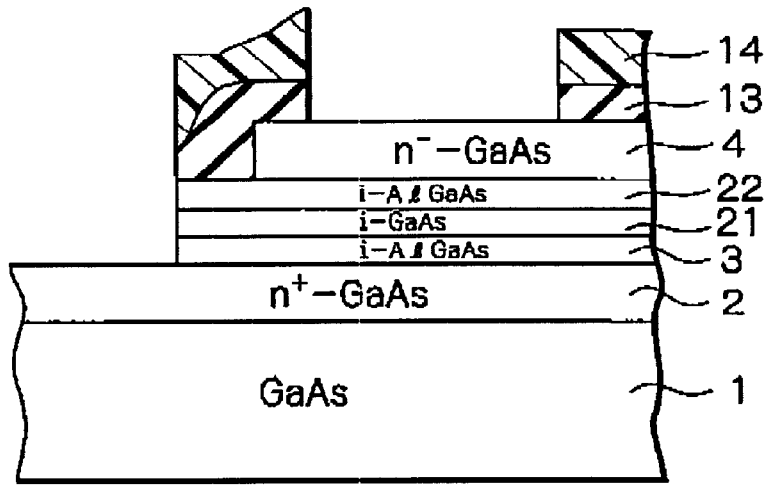

Next, referring to FIG. 11E, in the same way as in FIG. 5E, a photoresist pattern layer 14 is formed by a photolithography process. Then, the silicon oxide layer 13 is etched by a dry etching process using SF₆ gas.

Finally, an anode electrode 5 and a cathode electrode 6 are formed by a sputtering process and a lift-off process. Then, the photoresist pattern layer 14 is removed, to obtain the Schottky barrier diode SBD of FIG. 10. Note that the silicon oxide layer 13 is not shown in FIG. 10.

In the fourth embodiment, although the AlGaAs etching stopper layers 3 and 22 are undoped, the AlGaAs etching stopper layers 3 and 22 can be doped, i.e., of an n-type.

In the fourth embodiment, the cathode electrode 6 can be buried in the n⁺-type GaAs contact layer 2 in the same way as in the third embodiment, so as to further improve the low frequency noise characteristics.

Figure 12:
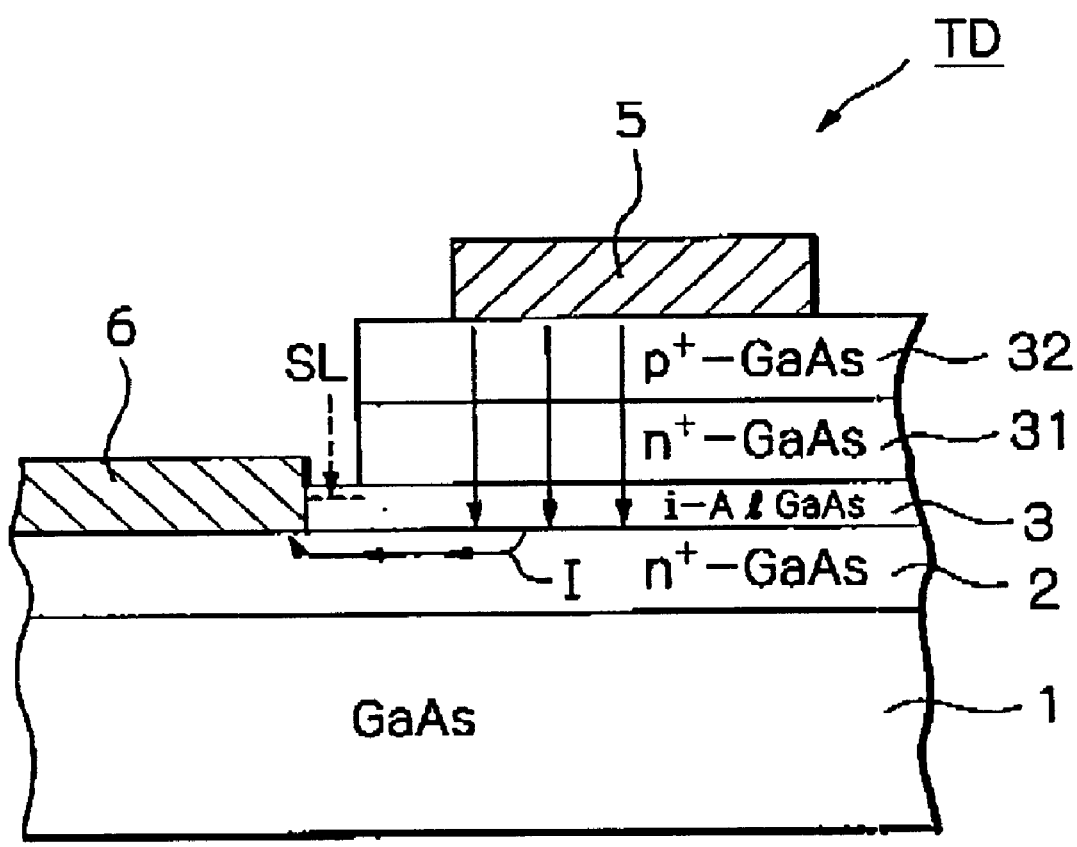
FIG. 12 is a cross-sectional view illustrating a fifth embodiment of the diode according to the present invention.

In FIG. 12, which illustrates a fifth embodiment of the diode according to the present invention that is, in this case, a tunnel diode TD, the tunnel diode TD is of a vertical type which is constructed by a semi-insulating GaAs substrate 1, an n⁺-type GaAs contact layer 2 formed on the GaAs substrate 1, an undoped AlGaAs etching stopper layer 3 formed on the n⁺-type GaAs contact layer 2, an n⁺-type GaAs layer 31 formed on the i-type AlGaAs etching stopper layer 3, a p+-type GaAs layer 32 formed on the n⁺-type GaAs layer 31, an anode electrode 5 formed on the p+-type GaAs layer 32, and a cathode electrode 6 formed on the n⁺-type GaAs contact layer 2.

In the tunnel diode TD of FIG. 12, when a forward bias voltage is applied to the anode electrode 5 and the cathode electrode 6, a current as indicated by an arrow I flows from the anode electrode 5 via the p+-type GaAs layer 32 to the n⁺-type GaAs layer 31 perpendicular to the-surface thereof, and then, the current I flows from the n⁺-type GaAs layer 31 via the i-type AlGaAs etching stopper layer 3 and the n⁺-type GaAs contact layer 2 to the cathode electrode 6 in parallel with the surface of the n⁺-type GaAs contact layer 2.

Even in the tunnel diode TD of FIG. 12, although the path of the current I adjacent to the surface of the n⁺-type GaAs contact layer 2 is still close thereto, there is no surface level within the n⁺-type GaAs contact layer 2 due to the presence of the i-type AlGaAs etching stopper layer 3. In this case, a surface level SL may be generated in the i-type AlGaAs etching stopper layer 3; however, the path of the current I is distant from this surface level SL. Therefore, the current I is hardly affected by the surface level SL of the i-type AlGaAs etching stopper layer 3. As a result, the low frequency noise characteristics of the tunnel diode TD of FIG. 12 can be improved.

The method for manufacturing the tunnel diode TD of FIG. 12 will be explained next with reference to FIGS. 13A through 13E.

Figure 13A:
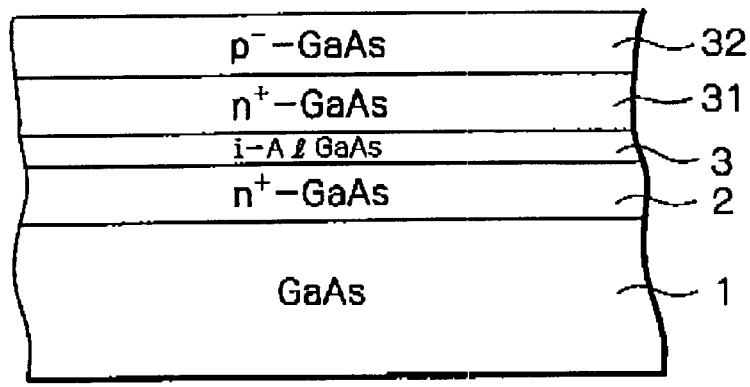
FIGS. 13A through 13E are cross-sectional views for explaining a method for manufacturing the diode of FIG. 12.

First, referring to FIG. 13A, an n⁺-type GaAs contact layer 2, an i-type AlGaAs etching stopper layer 3, an n⁺-type GaAs layer 31, a p+-type GaAs layer 32 and an n⁻-type GaAs layer 4 are grown on a semi-insulating substrate 1 by an MBE process, an MOCVD process or a VPE process. In this case, the i-type AlGaAs etching stopper layer 3 is about 50 Å thick.

Figure 13B:
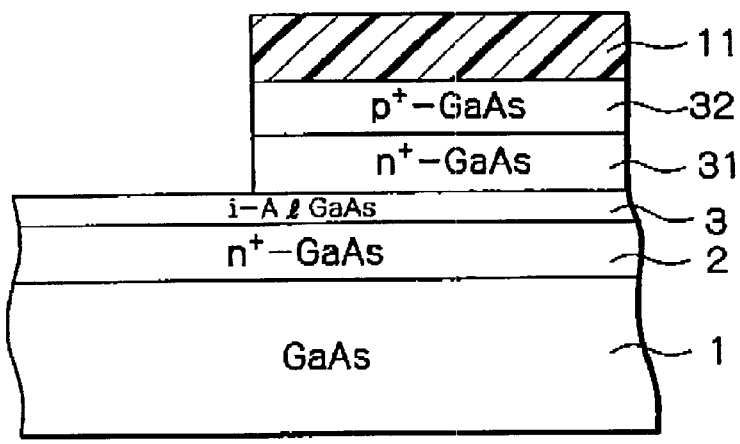

Next, referring to FIG. 13B, a photoresist pattern layer 11 is formed by a photolithography process. Then, the p+-type GaAs layer 32 and the n⁺-type GaAs layer 31 are etched by a 1 selective dry etching process using BCl₃ gas and the i-type AlGaAs etching stopper layer 3 as an etching stopper. Then, the photoresist pattern layer 11 is removed.

Figure 13C:
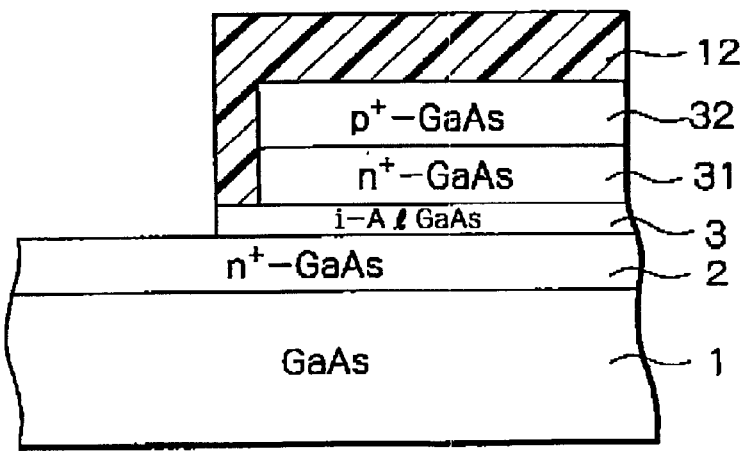

Next, referring to FIG. 13C, in the same way as in FIG. 5C, a photoresist pattern layer 12 is formed by a photolithography process. Then, the i-type AlGaAs etching stopper layer 3 is etched by a wet etching process using hydrogen peroxide water and the n⁺-type GaAs layer 2 as an etching stopper. Then, the photoresist pattern layer 12 is removed.

Figure 13D:
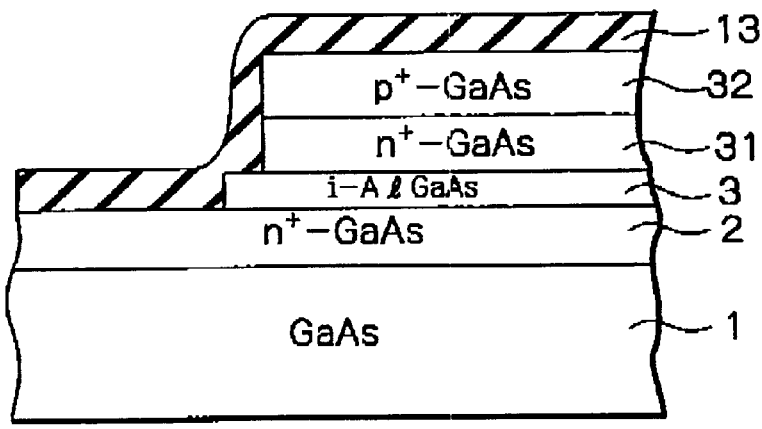

Next, referring to FIG. 13D, in the same way as in FIG. 5D, a silicon oxide layer 13 is deposited by a CVD process.

Figure 13E:
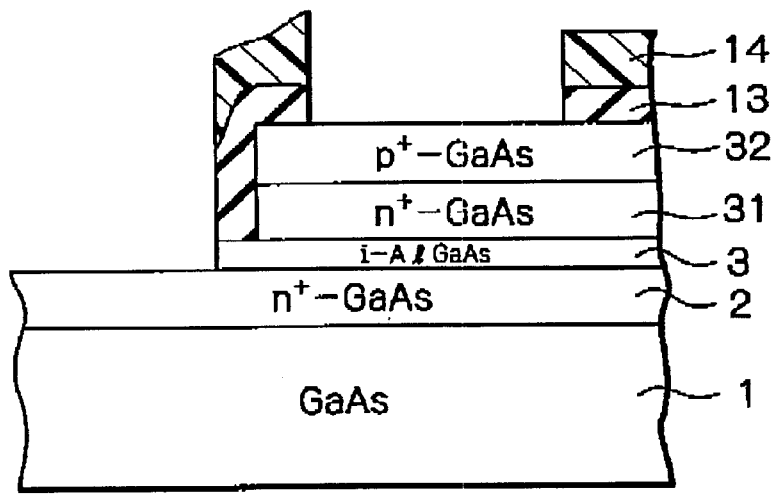

Next, referring FIG. 13E in the same way as in to FIG. 5E, a photoresist pattern layer 14 is formed by a photolithography process. Then, the silicon oxide layer 13 is etched by a dry etching process using SF₆ gas.

Finally, an anode electrode 5 and a cathode electrode 6 are formed by a sputtering process and a lift-off process. Then, the photoresist pattern layer 14 is removed, to obtain the tunnel diode TD of FIG. 12. Note that the silicon oxide layer 13 is not shown in FIG. 12.

In the fifth embodiment, although the AlGaAs etching stopper layer 3 is undoped, the AlGaAs etching stopper layer 3 can be doped, i.e., of an n-type.

In the fourth embodiment, the cathode electrode 6 can be buried in the n⁺-type GaAs contact layer 2 in the same way as in the third embodiment, so as to further improve the low frequency noise characteristics.

Figure 14:
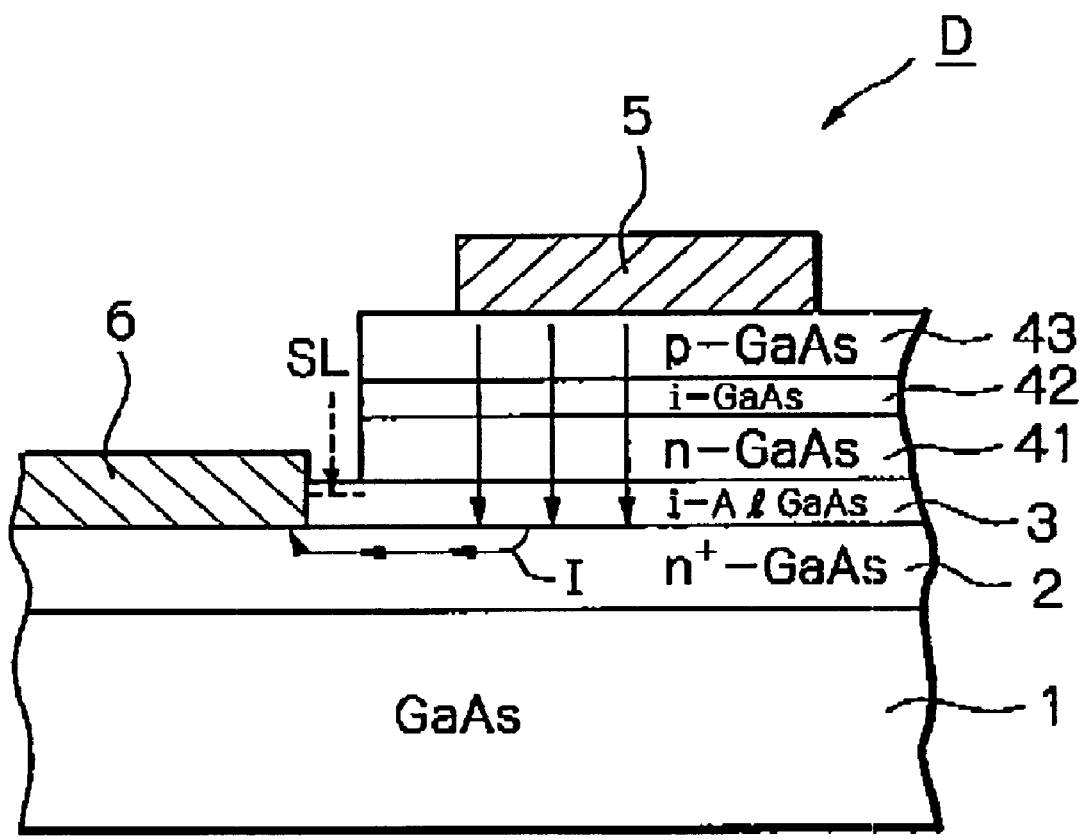
FIG. 14 is a cross-sectional view illustrating a sixth embodiment of the diode according to the present invention.

In FIG. 14, which illustrates a sixth embodiment of the diode according to the present invention that is, in this case, a PIN diode D, the PIN diode D is of a vertical type which is constructed by a semi-insulating GaAs substrate 1, an n⁺-type GaAs contact layer 2 formed on the GaAs substrate 1, an undoped AlGaAs etching stopper layer 3 formed on the n⁺-type GaAs contact layer 2, an n-type GaAs layer 41 formed on the i-type AlGaAs etching stopper layer 3, an i-type GaAs layer 42 formed on the n-type GaAs layer 41 a p-type GaAs layer 43 formed on the i-type GaAs layer 42, an anode electrode 5 formed on the p-type GaAs layer 43, and a cathode electrode 6 formed on the n⁺-type GaAs contact layer 2.

In the PIN diode D of FIG. 14, when a forward bias voltage is applied to the anode electrode 5 and the cathode electrode 6, a current as indicated by an arrow I flows from the anode electrode 5 via the p-type GaAs layer 43 and the i-type GaAs layer 42 to the n-type GaAs layer 41 perpendicular to the surface thereof, and then, the current I flows from the n-type GaAs layer 41 via the i-type AlGaAs etching stopper layer 3 and the n⁺-type GaAs contact layer 2 to the cathode electrode 6 in parallel with the surface of the n⁺-type GaAs contact layer 2.

Even in the PIN diode D of FIG. 14, although the path of the current I adjacent to the surface of the $n^+$-type GaAs contact layer 2 is still close thereto, there is no surface level within the $n^+$-type GaAs contact layer 2 due to the presence of the i-type AlGaAs etching stopper layer 3. In this case, a surface level SL may be generated in the i-type AlGaAs etching stopper layer 3; however, the path of the current I is distant from this surface level SL. Therefore, the current I is hardly affected by the surface level SL of the i-type AlGaAs etching stopper layer 3. As a result, the low frequency noise characteristics of the PIN diode D of FIG. 14 can be improved.

The method for manufacturing the tunnel diode D of FIG. 14 will be explained next with reference to FIGS. 15A through 15E.

Figure 15A:
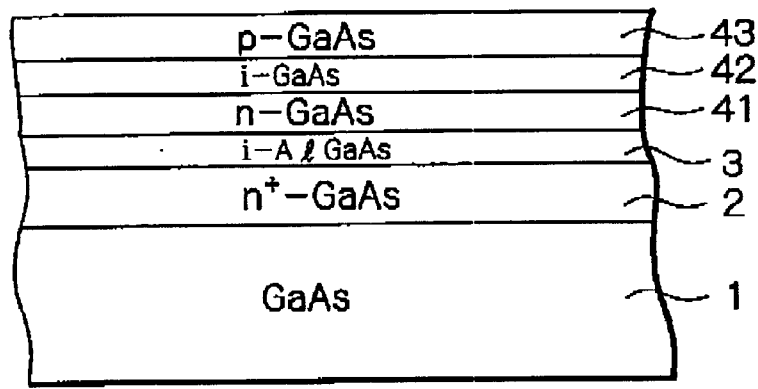
FIGS. 15A through 15E are cross-sectional views for explaining a method for manufacturing the diode of FIG. 14.

First, referring to FIG. 15A, an $n^+$-type GaAs contact layer 2, an i-type AlGaAs etching stopper layer 3, an n-type GaAs layer 41, an i-type GaAs layer 42 a p-type GaAs layer 43 and an n-type GaAs layer 4 are grown on a semi-insulating substrate 1 by an MBE process, an MOCVD process or a VPE process. In this case, the i-type AlGaAs etching stopper layer 3 is about 50 Å thick.

Figure 15B:
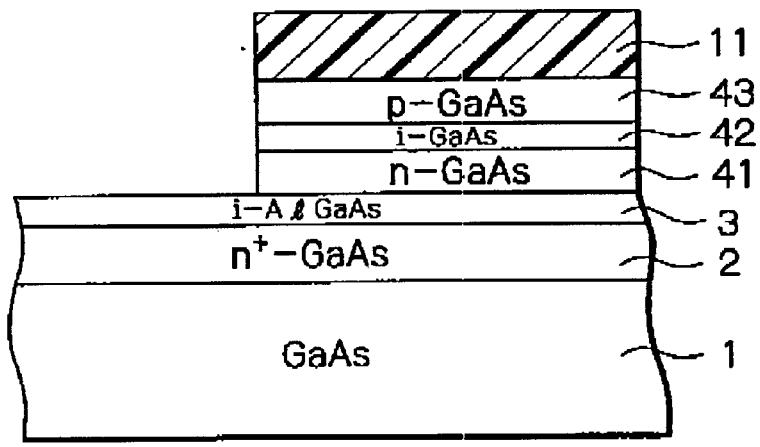

Next, referring to FIG. 15B, a photoresist pattern layer 11 is formed by a photolithography process. Then, the p-type GaAs layer 43, the i-type GaAs layer 42 and the n-type GaAs layer 41 are etched by a 1 selective dry etching process using $BCl_3$ gas and the i-type AlGaAs etching stopper layer 3 as an etching stopper. Then, the photoresist pattern layer 11 is removed.

Figure 15C:
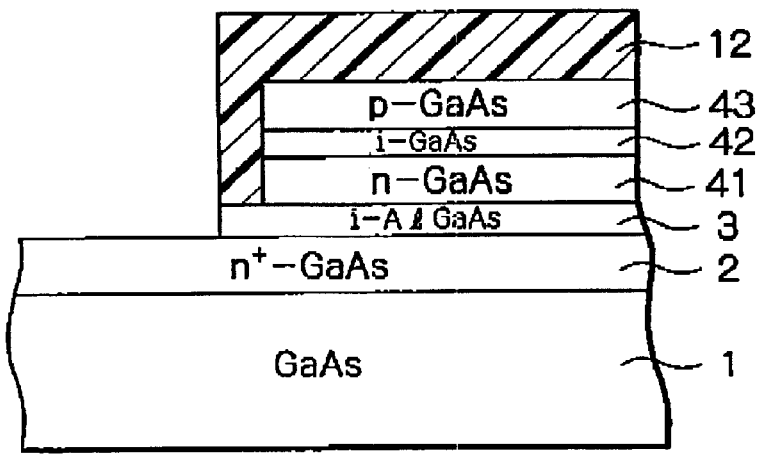

Next, referring to FIG. 15C, in the same way as in FIG. 5C, a photoresist pattern layer 12 is formed by a photolithography process. Then, the i-type AlGaAs etching stopper layer 3 is etched by a wet etching process using hydrogen peroxide water and the $n^+$-type GaAs layer 2 as an etching stopper. Then, the photoresist pattern layer 12 is removed.

Figure 15D:
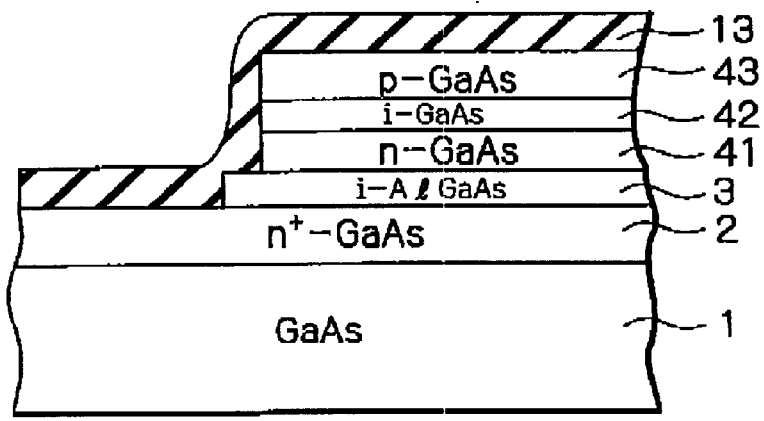

Next, referring to FIG. 15D, in the same way as in FIG. 5D, a silicon oxide layer 13 is deposited by a CVD process.

Figure 15E:
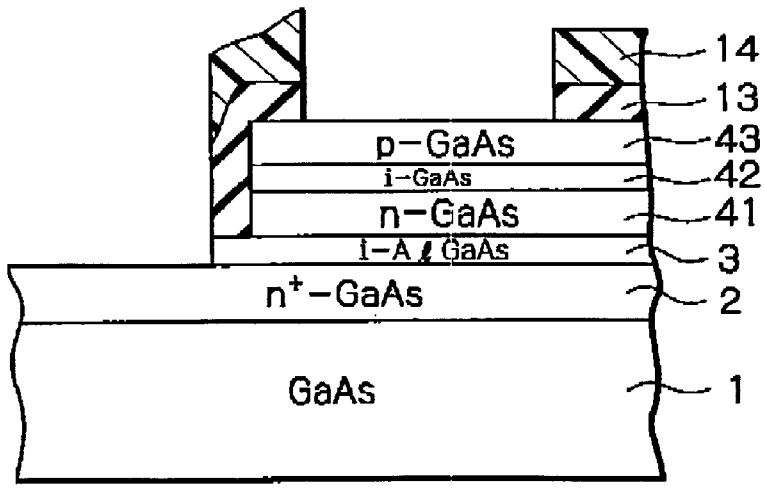

Next, referring FIG. 15E in the same way as in to FIG. 5E, a photoresist pattern layer 14 is formed by a photolithography process. Then, the silicon oxide layer 13 is etched by a dry etching process using $SF_6$ gas.

Finally, an anode electrode 5 and a cathode electrode 6 are formed by a sputtering process and a lift-off process. Then, the photoresist pattern layer 14 is removed, to obtain the PIN diode D of FIG. 14. Note that the silicon oxide layer 13 is not shown in FIG. 14.

In the sixth embodiment, although the AlGaAs etching stopper layer 3 is undoped, the AlGaAs etching stopper layer 3 can be doped, i.e., of an n-type.

In the sixth embodiment, the cathode electrode 6 can be buried in the $n^+$-type GaAs contact layer 2 in the same way as in the third embodiment, so as to further improve the low frequency noise characteristics.

Figure 16:
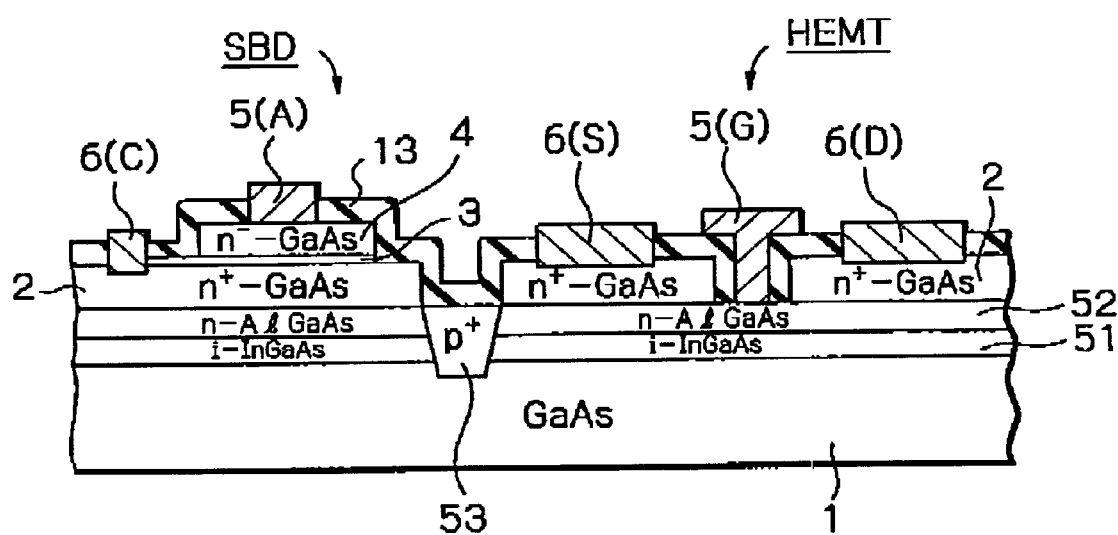
FIG. 16 is a cross-sectional view illustrating a semiconductor device in which the Schottky barrier diode of FIG. 6 is combined with a high electron mobility transistor.

FIG. 16 is a cross-sectional view illustrating a semiconductor device in which the Schottky diode SBD of FIG. 6 is combined with a high electron mobility transistor HEMT.

In FIG. 15, an i-type InGaAs channel layer 51 and an n-type AlGaAs electron supply layer 52 are formed on the GaAs substrate 1 for the high electron mobility transistor HEMT. In this case, the i-type InGaAs channel layer 51 and the n-type AlGaAs electron supply layer 52 are meaningless for the Schottky barrier diode SBD. Also, the Schottky barrier diode SBD and the high electron mobility transistor HEMT are isolated from each other by a p+-type isolation region 53.

Further, a gate electrode 5(G) is made of the same material as the anode electrode 5(A), and a source electrode 6(S) and a drain electrode 6(D) are made of the sate material as the cathode electrode 6(C).

The method for manufacturing the-semiconductor device of FIG. 16 wilt be explained next with reference to FIGS. 17A through 17II.

Figure 17A:
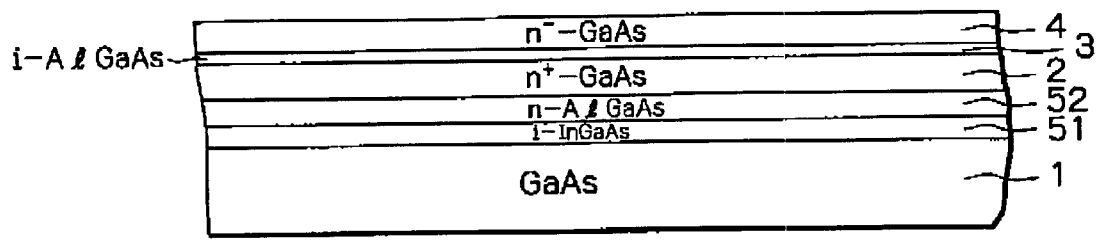
FIGS. 17A through 17H are cross-sectional views for explaining a method for manufacturing the semiconductor device of FIG. 16.

First, referring to FIG. 17A, an i-type InGaAs channel layer 51, art n-type AlGaAs electron supply layer 52, an $n^+$-type GaAs contact layer 2, an i-type AlGaAs etching stopper layer 3 and an a-type GaAs layer 4 are grown on a semi-insulating GaAs substrate 1 by an MBE process, a MOCVD process or a VPE process. In this case, the i-type AlGaAs etching stopper layer 3 is about 50 Å thick.

Figure 17B:
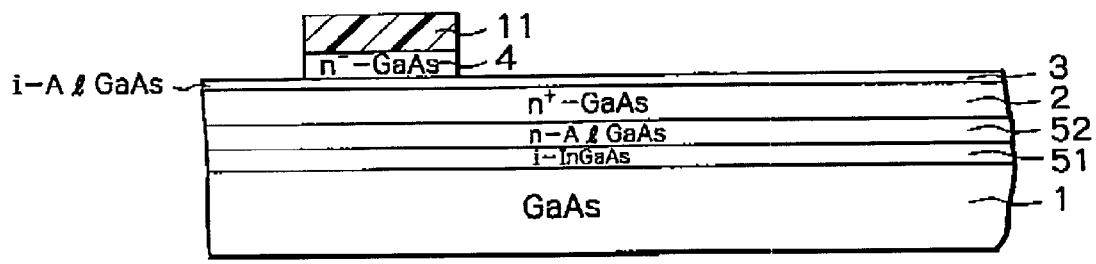

Next, referring to FIG. 17B, a photoresist pattern layer it is formed by a photolithography process. Then, the $n^-$-type GaAs layer 4 is etched by a selective dry etching process using $BCl_3$ gas and the i-type AlGaAs etching stopper layer 3 as an etching stopper. Then, the photoresist pattern layer 11 is removed.

Figure 17C:
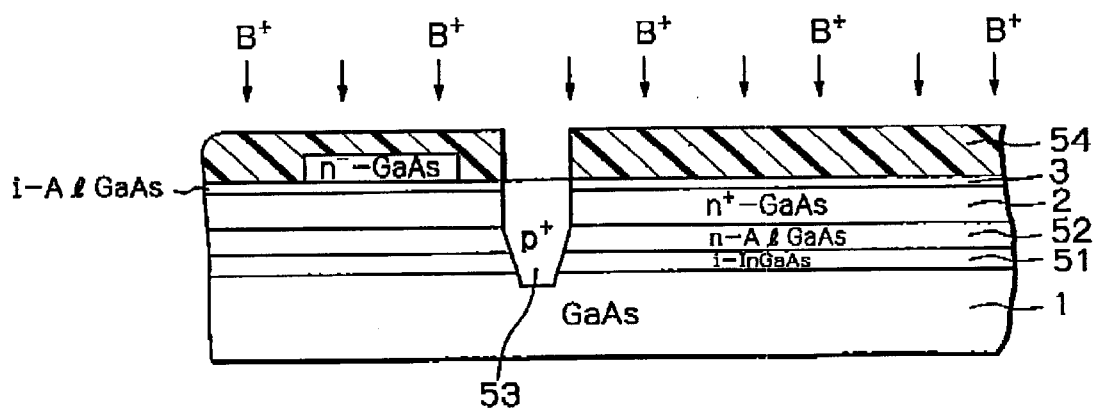

Next, referring to FIG. 17C, a photoresist pattern layer 54 is formed by a photolithography process. Then, boron ions are implanted into the GaAs substrate 1 as well as the layers 51, 52, 2 and 3. As a result, a p+-type isolation region 53 is formed. Then, the photoresist pattern 54 is removed.

Figure 17D:
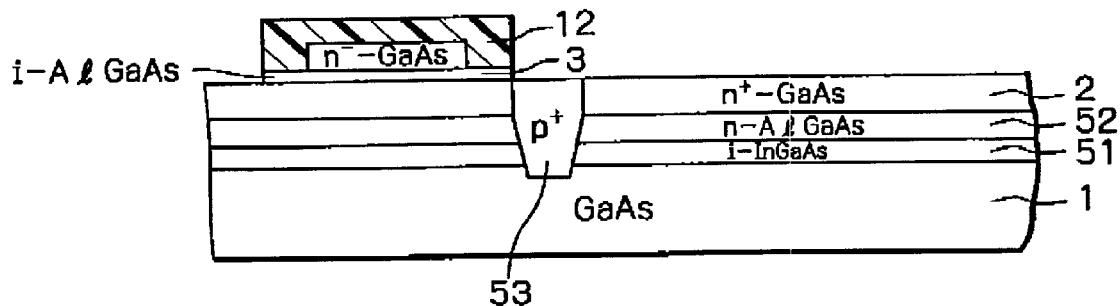

Next, referring to FIG. 17D, a photoresist pattern layer 12 is formed by a photolithography process. Then, the i-type AlGaAs etching stopper layer 3 is etched by a wet etching process using hydrogen peroxide water and the $n^+$-type GaAs layer 2 as an etching stopper. Then, the photoresist pattern layer 12 is removed.

Figure 17E:
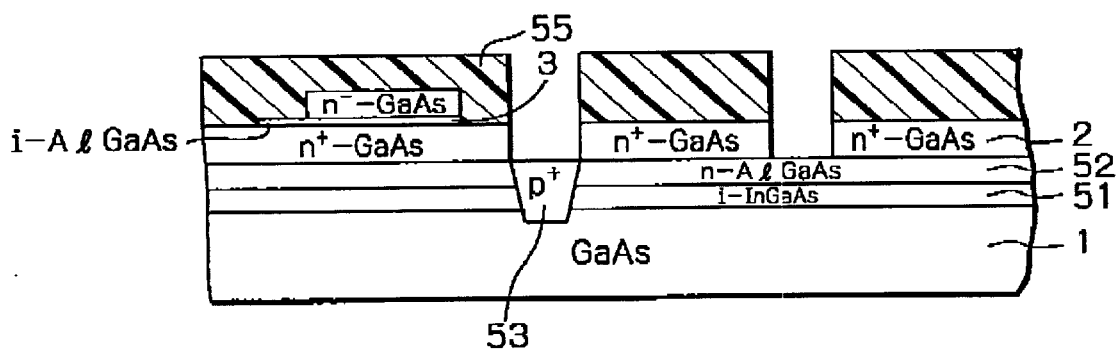

Next, referring to FIG. 17E, a photoresist pattern layer 55 is formed by a photolithography process. Then, the $n^+$-type GaAs layer 2 is etched by a selective dry etching process using $BCl_3$ gas and the n-type AlGaAs etching stopper layer 52 as an etching stopper. Then, the photoresist pattern layer 55 is removed.

Figure 17F:
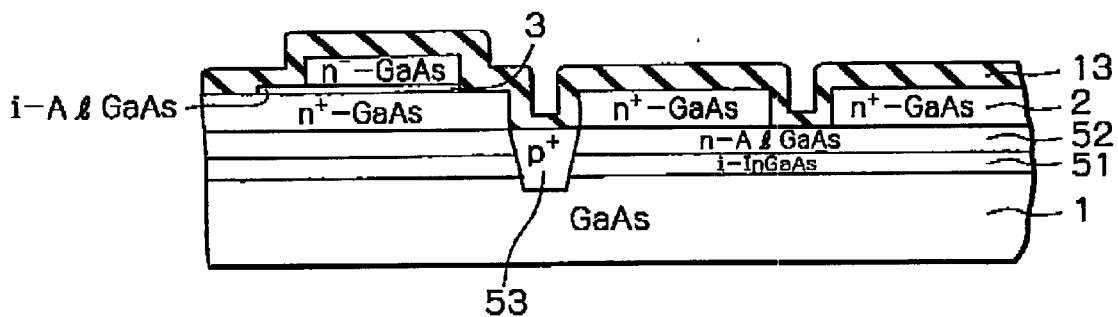

Next, referring to FIG. 17F, a silicon oxide layer 13 is deposited by a CVD process.

Figure 17G:
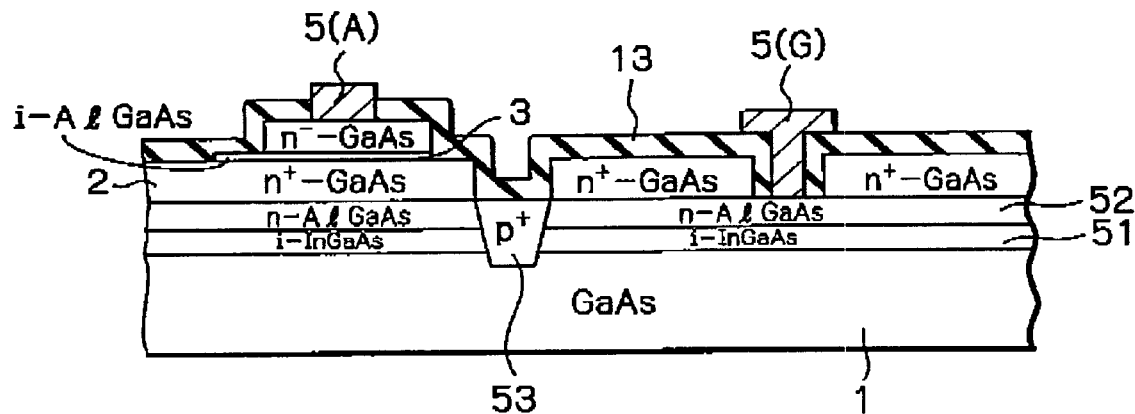

Next, referring to FIG. 17G, the silicon oxide layer 13 is perforated by a photolithography and dry etching process using $SF_6$ gas to form openings for an anode electrode 5(A) and a gate electrode 5(G). Then, the anode electrode 5(A) and the gate electrode 5(C) are buried in the openings by a sputtering arid lift-off process.

Figure 17H:
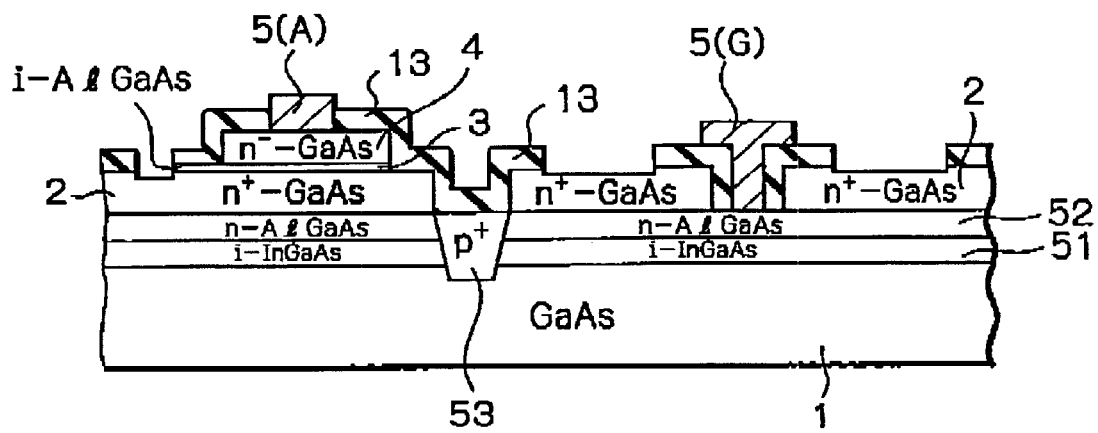

Next, referring to FIG. 17H, the silicon oxide layer 13 is perforated by a photolithography and dry etching process using $SF_6$ gas to form openings for a cathode electrode 6(C), a source electrode 5(G), 6(S) and a drain electrode 6(D). Then, the $n^+$-type GaAs contact layer 2 is etched by a wet etching process using phosphoric acid. In this case, the etching depth of the $n^+$-type GaAs contact layer 2 is about 100 Å. Then, the cathode electrode 6(C), the source electrode 6(C) and the drain electrode 6(D) are buried in the openings by a sputtering and lift-off process, to obtain the semiconductor device of FIG. 16.

In FIG. 16, although the AlGaAs etching stopper layer 3 is undoped, the AlGaAs etching stopper layer 3 can be doped, i.e., of an n-type. Also, the anode electrode 5(A) can be buried in the n-type GaAs layer 4, and the gate electrode 5(G) can be buried in the n-type AlGaAs layer 52.

Figure 18:
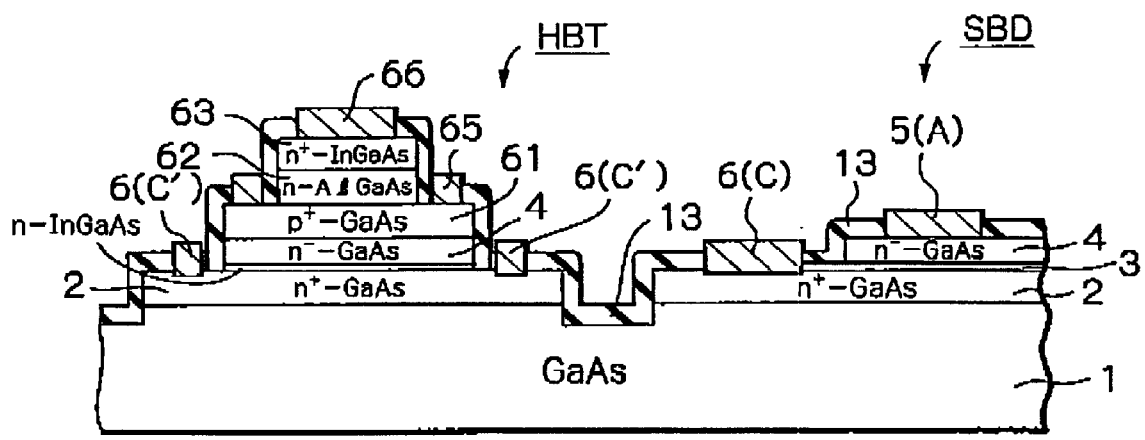
FIG. 18 is a cross-sectional view illustrating a semiconductor device in which the Schottky barrier diode of FIG. 6 is combined with a heterojunction bipolar transistor.

FIG. 18 is a cross-sectional view illustrating a semiconductor device in which the Schottky diode SBD of FIG. 6 is combined with a heterojunction bipolar transistor HBT.

In FIG. 18, the InGaAs etching stopper layer 3 is of an n-type. Also, the $n^+$-type GaAs contact layer 2 of the heterojunction bipolar transistor HBT serves as a collector contact layer, and the n-type GaAs layer 3 and the n-type GaAs layer 4 serve as a collector layer.

Additionally, the heterojunction bipolar transistor HBT is constructed by a p+-type GaAs base layer 61, an n-type AlGaAs emitter layer 62 and a n$^+$-type InGaAs emitter cap layer 63. Further, reference numeral 6(C') designates a collector electrode, 65 designates a base electrode, and 66 designates an emitter electrode. The collector electrode 6(C') are made of the same material as the cathode electrode 6(C).

The method for manufacturing the semiconductor device of FIG. 18 will be explained next with reference to FIGS. 19A through 19I.

Figure 19A:
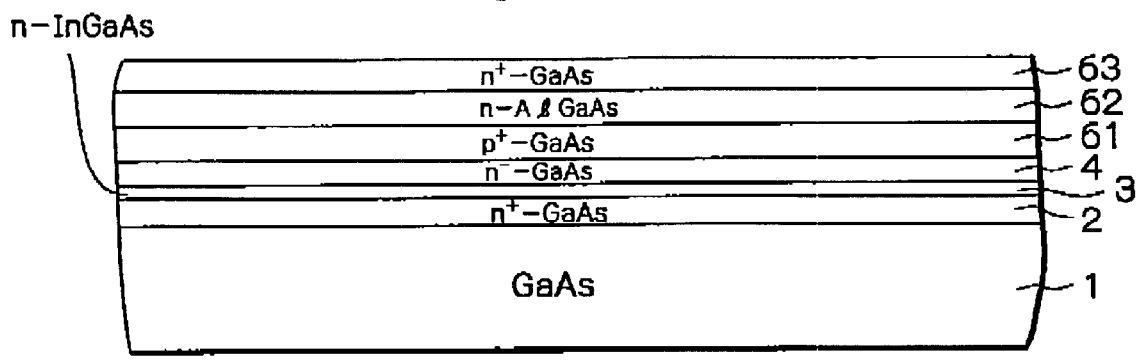
FIGS. 19A through 19I are cross-sectional views for explaining a method for manufacturing the diode of FIG. 18.

First, referring to FIG. 19A, an n$^+$-type GaAs contact layer 2, an n-type AlGaAs etching stopper layer 3, an n$^+$-type GaAs layer 4, a p+-type GaAs base layer 61, an n-type AlGaAs emitter layer 62, and an n$^+$-type InGaAs emitter cap layer 63 are grown on a semi-insulating GaAs substrate 1 by an MBE process, a MOCVD process or a CVE process. In this case, the n-type AlGaAs etching stopper layer 3 is about 60 Å thick.

Figure 19B:
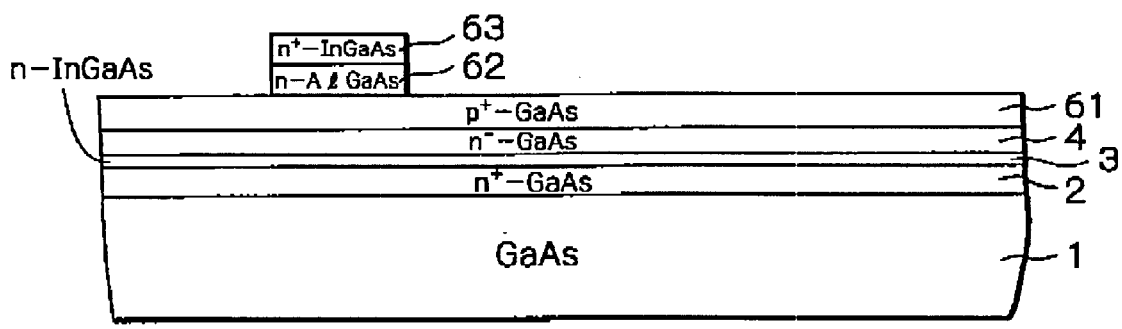

Next, referring to FIG. 19B, a photoresist pattern layer (not shown) is formed by a photolithography process to cover an emitter area. Then, the n$^+$-type InGaAs emitter cap layer 63 and the n$^-$-AlGaAs emitter layer 62 are etched by a wet or dry etching process using the photoresist pattern as a mask.

Figure 19C:
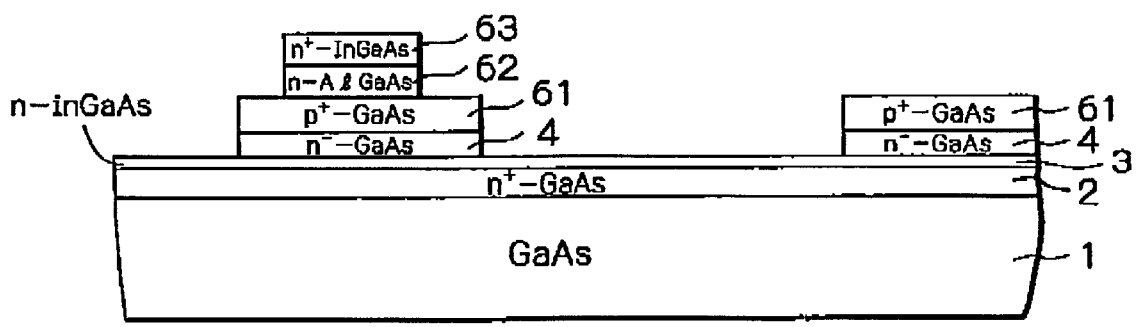

Next, referring to FIG. 19C, a photoresist pattern layer (not shown) is formed by a photolithography process to cover a base area and an anode area. Then, the n$^+$-type GaAs layer 61 and the n$^-$-GaAs layer 4 are etched by a selective dry etching process using BCl$_3$ gas and the photoresist pattern as a mask.

Figure 19D:
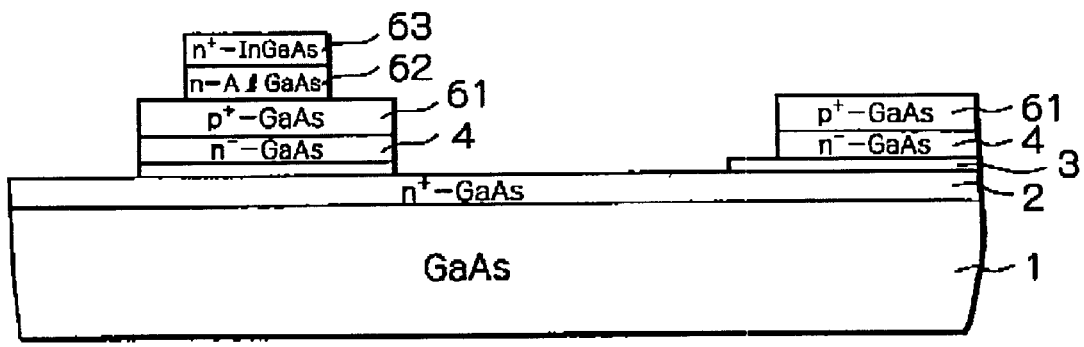

Next, referring to FIG. 19D, a photoresist pattern layer (not shown) is formed by a photolithography process to cover an area adjacent to the anode area. Then, the n-type InGaAs etching stopper layer 3 is etched by a wet etching process using hydrogen peroxide water.

Figure 19E:
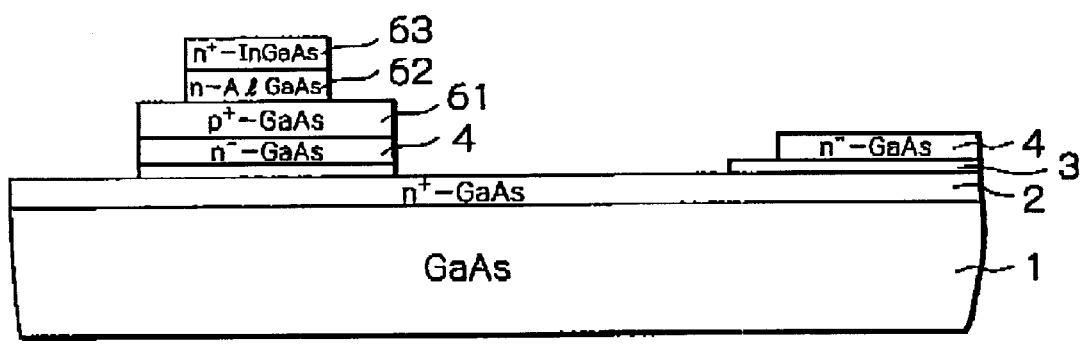

Next, referring to FIG. 19E, a photoresist pattern layer (not shown) is formed by a photolithography process to cover an area other than the anode area. Then, the p+-type GaAs layer 61 of the anode area is etched by a selective dry etching process using BCl$_3$ gas and the photoresist pattern layer as a mask.

Figure 19F:
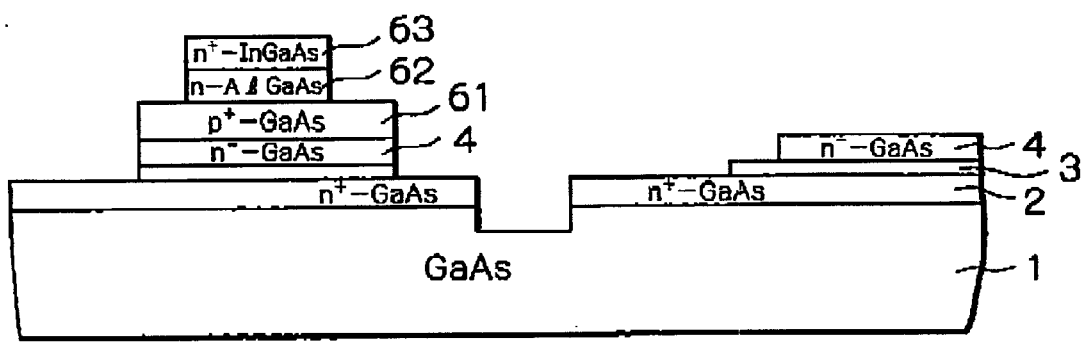

Next, referring to FIG. 19F, a photoresist patter layer (not shown) is formed by a photolithography process to cover an area where the Schottky barrier diode SBD and the heterojunction bipolar transistor HBT will be formed. Then, the n$^+$-type GaAs contact layer 2 and the GaAs substrate 1 are etched by using the photoresist pattern layer as a mask.

Figure 19G:
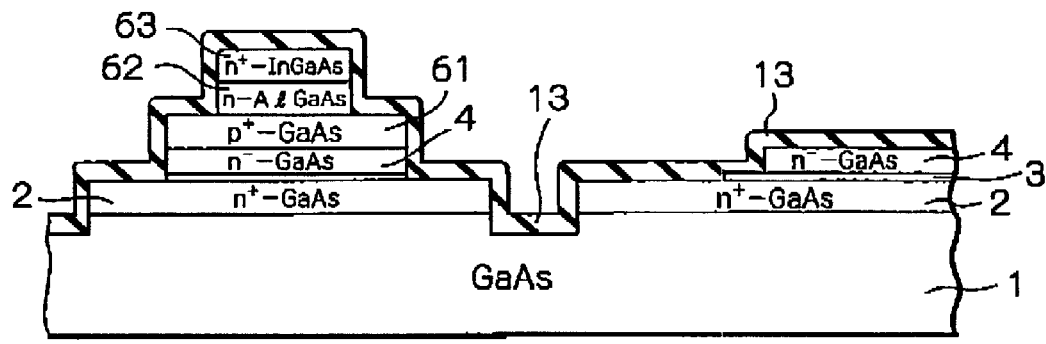

Next, referring to FIG. 19G, a silicon oxide layer 13 is deposited by a CVD process.

Figure 19H:
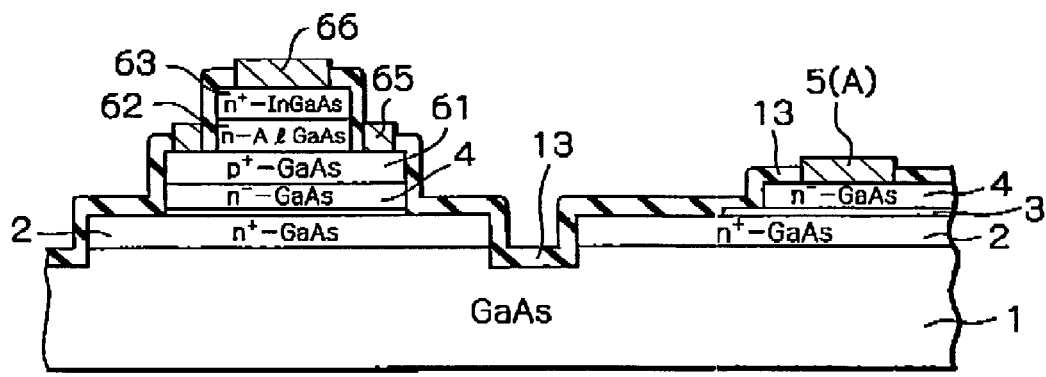

Next, referring to FIG. 19H, the silicon oxide layer 13 is perforated by a photolithography and dry etching process using SF$_6$ gas to form openings for an anode electrode 5(A), a base electrode 65 and an emitter electrode 66. Then, the anode electrode 5(A), the base electrode 65 and the emitter electrode 66 are buried in the openings by a sputtering and lift-off process.

Figure 19I:
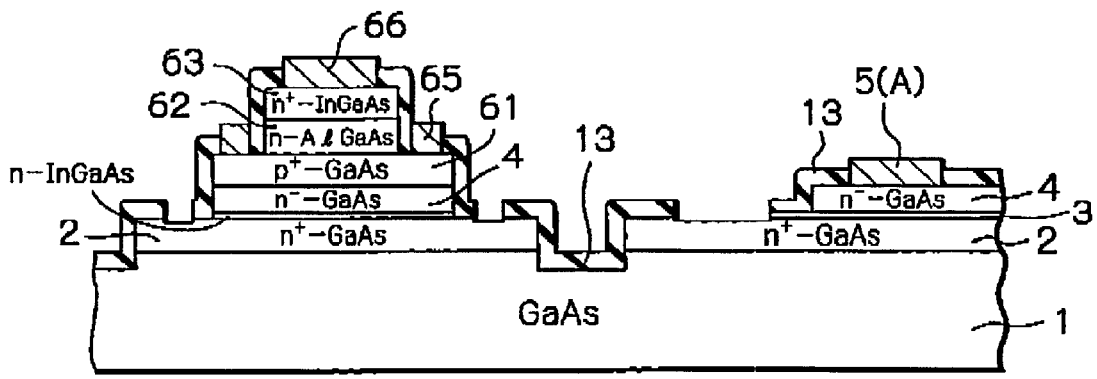

Next, referring to FIG. 19I, the silicon oxide layer 13 is perforated by a photolithography and dry etching process using SF$_6$ gas to form openings for a cathode electrode 6(C) and a collector electrode 6(C'). Then, the n$^+$-type GaAs contact layer 2 is etched by a wet etching process using phosphoric acid. In this case, the etching depth of the n$^+$-type GaAs contact layer 2 is about 100 Å. Then, the cathode electrode 6(C) and the collector electrode 6(C') are buried in the openings by a sputtering and lift-off process, to obtain the semiconductor device of FIG. 18.

In FIG. 18, the anode electrode 5(A) can be buried in the n$^-$-type GaAs layer 4, the base electrode 65 can be buried in the p+-type GaAs base layer 61, and the emitter electrode 66 can be buried in the n$^+$-type InGaAs emitter cap layer 63.

Figure 20:
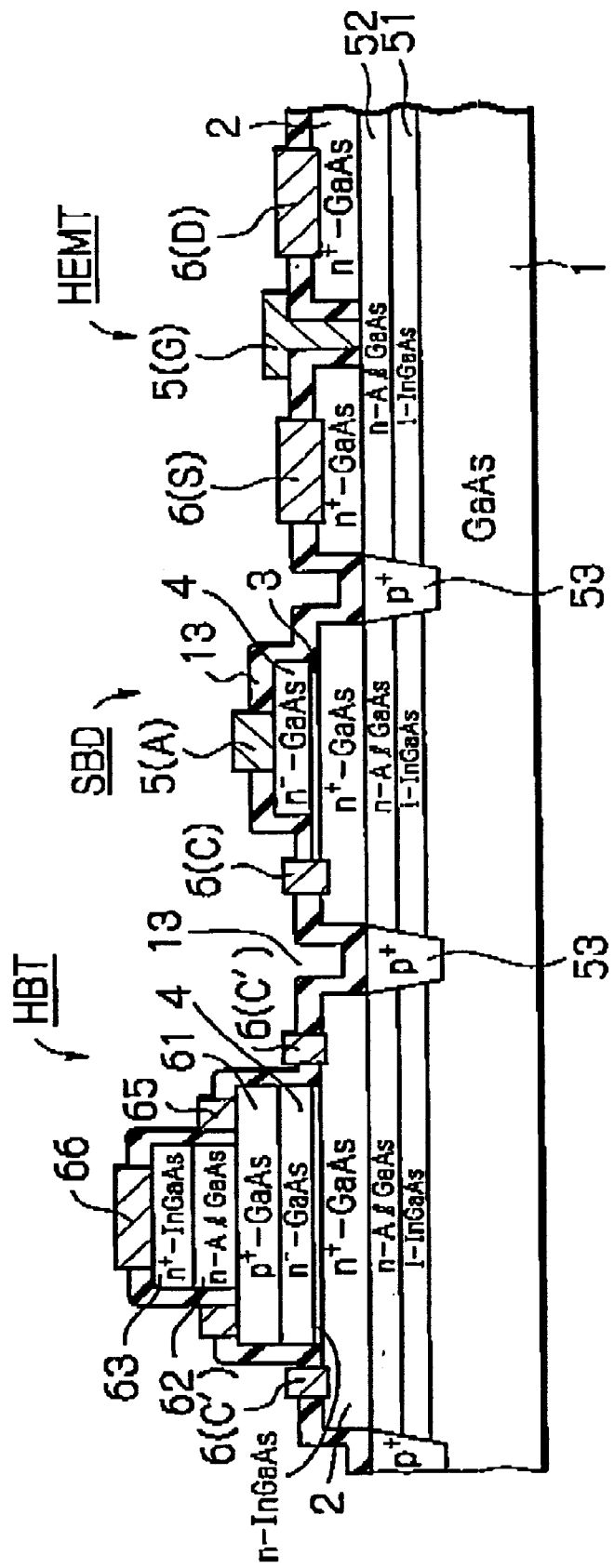
FIG. 20 is a cross-sectional view illustrating a semiconductor device in which the Schottky barrier diode of FIG. 6 is combined with a high electron mobility transistor and a heterojunction bipolar transistor.

FIG. 20 is a cross-sectional view illustrating a semiconductor device in which the Schottky diode SBD of FIG. 6 is combined with a high electron mobility transistor HEMT and a heterojunction bipolar transistor HBT.

In FIG. 20, the semiconductor device of FIG. 16 and the semiconductor device of FIG. 18 are combined altogether. In this case, the i-type InGaAs channel layer 51 and the n-type AlGaAs electron supply layer 52 are also formed in the heterojunction bipolar transistor HBT, however, the i-type InGaAs channel layer 51 and the n-type AlGaAs electron supply layer 52 are meaningless for the heterojunction bipolar transistor HBT.

Figure 21:
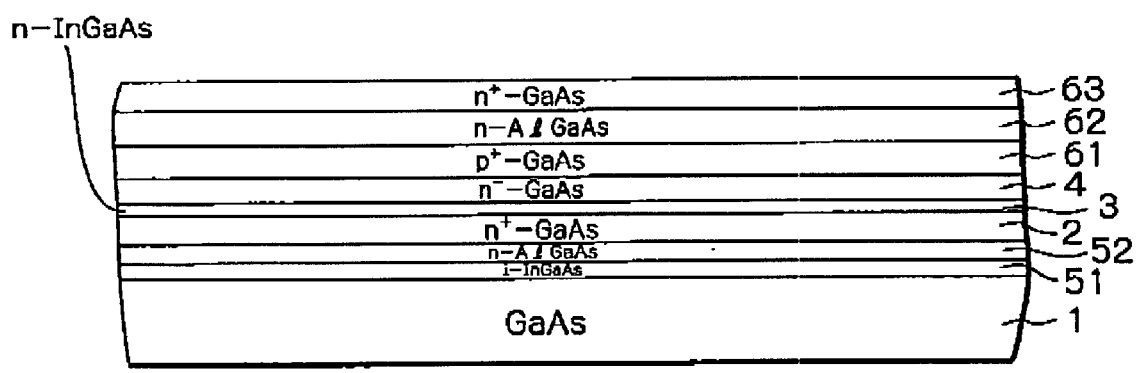
FIG. 21 is a cross-sectional view illustrating an epitaxial layer used in the manufacture of the semiconductor device of FIG. 20.

In order to manufacture the semiconductor device of FIG. 20, one epitaxial layer is grown on the GaAs substrate 1. That is, as illustrated in FIG. 21, an i-type InGaAs channel layer 51, an n-type AlGaAs electron supply layer 52, an n$^+$-type GaAs contact layer 2, an n-type AlGaAs etching stopper layer 3, an n$^+$-type GaAs layer 4, a p+-type GaAs base layer 61, an n-type AlGaAs emitter layer 62, and an n$^+$-type InGaAs emitter cap layer 63 are grown on a semi-insulating GaAs substrate 1 by an MBE process, a MOCVD process or a VPE process. In this case, the n-type AlGaAs etching stopper layer 3 is about 50 Å thick.

Other manufacturing steps of the semiconductor device of FIG. 20 are similar to those of the semiconductor device of FIG. 18.

In FIGS. 16, 18 and 20, since an epitaxial growing process is carried out only once, no deep trap level is generated, which would improve the low frequency noise characteristics. Also, the manufacturing cost would be decreased. Further, the characteristics among wafers and among lots hardly fluctuate, which would increase the manufacturing yield.

In FIGS. 16, 18 and 20, although the Schottky barrier diode of FIG. 6 is combined with a high electron mobility transistor HEMT and/or a heterojunction bipolar transistor HBT, the Schottky barrier diode SBD of FIGS. 4 and 7, the tunnel diode TD of FIG. 8 and the PIN diode of FIG. 10 can be combined with a high electron mobility transistor HEXT and/or a heterojunction bipolar transistor HBT.

As explained hereinabove, according to the present invention, since the path of a current is distant from the surface level which would generate low frequency noise, the low frequency characteristics can be improved.

What is claimed is:

1. A semiconductor device comprising:

a semiconductor substrate;

a first semiconductor layer formed on said semiconductor substrate;

a second semiconductor layer formed on a part of said first semiconductor layer;

a third semiconductor layer formed on a part of said second semiconductor layer;

a first electrode formed on said third semiconductor layer; and a second electrode formed on said first semiconductor layer in contact with said second semiconductor layer and apart from said third semiconductor layer;

thus forming a diode.

2. The semiconductor device as set forth in claim 1, wherein said first and third semiconductor layers are of one conductivity type, and said second semiconductor layer is undoped, so that said diode is a Schottky barrier diode.

3. The semiconductor device as set forth in claim 1, wherein said first, second and third semiconductor layers are of one conductivity type, so that said diode is a Schottky barrier diode.

4. The semiconductor device as set forth in claim 1, wherein said first and third semiconductor layers have a different material from that of said second semiconductor layer.

5. The semiconductor device as set forth in claim 1, wherein said second electrode is buried in said first semiconductor layer.

6. The semiconductor device as set forth in claim 1, further comprising:
   a fourth semiconductor layer formed on said second semiconductor layer; and
   a fifth semiconductor layer formed on said fourth semiconductor layer,
   said second and fifth semiconductor layers being made of a material different from that of said first, third and fourth semiconductor layers.

7. The semiconductor device as set forth in claim 1, further comprising a fourth semiconductor layer formed on said third semiconductor layer,
   said first and third semiconductor layers being of a first conductivity type, said fourth semiconductor layer being a second conductivity type opposite to said first conductivity type, so that said diode is a tunnel diode.

8. The semiconductor device as set forth in claim 6, wherein said second semiconductor layer is undoped.

9. The semiconductor device as set forth in claim 6, wherein said second semiconductor layer is of said first conductivity type.

10. The semiconductor device as set forth in claim 1, further comprising;
    a fourth semiconductor layer of an i-type conductivity type formed on said third semiconductor layer; and
    a fifth semiconductor layer formed on said fourth semiconductor layer,
    said first and third semiconductor layers being of a first conductivity type, said fifth semiconductor layer being of a second conductivity type opposite to said first conductivity type, so that said diode is a PIN diode.

11. The semiconductor device as set forth in claim 10, wherein said second semiconductor layer is undoped.

12. The semiconductor device as set forth in claim 10, wherein said second semiconductor layer is of said first conductivity type.

13. The semiconductor device as set forth in claim 1, further comprising:
    an i-type channel layer between said semiconductor substrate and said first semiconductor layer; and
    a charge supply layer formed between said i-type channel layer and said first semiconductor layer,
    said i-type channel layer, said charge supply layer and said first semiconductor layer forming a heterojunction field effect transistor separated from said diode.

14. The semiconductor device as set forth in claim 13, wherein said diode and said field effect transistor are separated by an isolation region therebetween in said i-type channel layer and said charge supply layer.

15. The semiconductor device as set forth in claim 1, further comprising;
    a semiconductor base layer having a conductivity type opposite to that of said third semiconductor layer formed on said third semiconductor layer;
    a semiconductor emitter layer having the same conductivity type as that of said third semiconductor layer formed on said semiconductor base layer; and
    a semiconductor emitter cap layer having the same conductivity type as that of said third semiconductor layer formed on said semiconductor emitter layer;
    said first, second and third semiconductor layers,said semiconductor base layer, said semiconductor emitter layer and said semiconductor emitter cap layer forming a heterojunction bipolar transistor separated from said diode .

16. The semiconductor device as set forth in claim 15, wherein said diode and said bipolar transistor are separated by a groove formed in said first semiconductor layer and said semiconductor substrate.

17. A semiconductor device comprising:
    a semiconductor substrate;
    a first semiconductor layer formed on said semiconductor substrate;
    a second semiconductor layer formed on a part of said first semiconductor layer;
    a first electrode formed on said second semiconductor layer;
    a second electrode buried in said first semiconductor layer and apart from said second semiconductor layer, thus forming a diode;
    a third semiconductor layer formed on said first semiconductor layer; and
    a fourth semiconductor layer formed on said third semiconductor layer,
    said second and fourth semiconductor layers being made of a material different from that of said first, second and third semiconductor layers.

18. A semiconductor device comprising:
    a semiconductor substrate;
    a first semiconductor layer formed on said semiconductor substrate;
    a second semiconductor layer formed on a part of said first semiconductor layer;
    a first electrode formed on said second semiconductor layer;
    a second electrode buried in said first semiconductor layer and apart from said second semiconductor layer, thus forming a diode; and
    a third semiconductor layer formed on said second semiconductor layer, said first and second semiconductor layers being of a first conductivity type,
    said third semiconductor layer being a second conductivity type opposite to said first conductivity type, so that said diode is a tunnel diode.

19. A semiconductor device comprising:
    a semiconductor substrate;
    a first semiconductor layer formed on said semiconductor substrate;
    a second semiconductor layer formed on a part of said first semiconductor layer;
    a first electrode formed on said second semiconductor layer;

a second electrode buried in said first semiconductor layer and apart from said second semiconductor layer, thus forming a diode;

a third semiconductor layer of an i-type conductivity type second on said second semiconductor layer; and a fourth semiconductor layer formed on said third semiconductor layer, said first and second semiconductor layers being of a first conductivity type, said fourth semiconductor layer being of a second conductivity type opposite to said first conductivity type, so that said diode is a PIN diode.

20. A semiconductor device comprising:

a semiconductor substrate;

a first semiconductor layer formed on said semiconductor substrate;

a second semiconductor layer formed on a part of said first semiconductor layer;

a first electrode formed on said second semiconductor layer;

a second electrode buried in said first semiconductor layer and apart from said second semiconductor layer, thus forming a diode;

an i-type channel layer between said semiconductor substrate and said first semiconductor layer; and a charge supply layer formed between said i-type channel layer and said first semiconductor layer, said i-type channel layer, said charge supply layer and said first semiconductor layer forming a heterojunction field effect transistor separated from said diode.

21. The semiconductor device as set forth in claim 20, wherein said diode and said field effect transistor are separated by an isolation region therebetween in said i-type channel layer and said charge supply layer.

22. A semiconductor device comprising:

a semiconductor substrate;

a first semiconductor layer formed on said semiconductor substrate;

a second semiconductor layer formed on a part of said first semiconductor layer;

a first electrode formed on said second semiconductor layer;

a second electrode buried in said first semiconductor layer and apart from said second semiconductor layer, thus forming a diode;

a semiconductor base layer having a conductivity type opposite to that of said third semiconductor layer formed on said second semiconductor layer;

a semiconductor emitter layer having the same conductivity type as that of said second semiconductor layer formed on said semiconductor base layer; and a semiconductor emitter cap layer having the same conductivity type as that of said second semiconductor layer formed on said semiconductor emitter layer, said first and second semiconductor layers, said semiconductor base layer, said semiconductor emitter layer and said semiconductor emitter cap layer forming a heterojunction bipolar transistor separated from said diode.

23. The semiconductor device as set forth in claim 22, wherein said diode and said bipolar transistor are separated by a groove formed in said first semiconductor layer and said semiconductor substrate.

* * * * *

UNITED STATES PATENT AND TRADEMARK OFFICE
CERTIFICATE OF CORRECTION

PATENT NO. : 6,525,346 B2
DATED : February 25, 2003
INVENTOR(S) : Hiroshi Mizutani It is certified that error appears in the above-identified patent and that said Letters Patent is hereby corrected as shown below:

Column 10,
Line 3, delete "sate" insert -- same --;
Line 5, delete "the –" insert -- the --;
Line 6, delete "wilt" insert -- will --;
Line 9, delete "art" insert -- an --;
Line 15, delete "it" insert -- 11 --;
Line 44, delete "5(c)" insert -- 5 (G) --

Column 11,
Line 15, delete "$n^+$ - type GaAs layer 4" insert -- $n^-$ - type GaSa layer 4 --;
Line 31, delete "$n^+$ - type" insert -- $p^+$ - type --

Column 12,
Line 46, delete "HEXT" insert -- HEMT --

Column 14,
Line 12, delete "layers,said" insert -- layers, said --

Signed and Sealed this

First Day of July, 2003

JAMES E. ROGAN
*Director of the United States Patent and Trademark Office*